United States Patent
Bondokov et al.

(10) Patent No.: US 12,264,410 B2
(45) Date of Patent: Apr. 1, 2025

(54) ALUMINUM NITRIDE CRYSTALS HAVING LOW URBACH ENERGY AND HIGH TRANSPARENCY TO DEEP-ULTRAVIOLET WAVELENGTHS

(71) Applicants: Robert T. Bondokov, Watervliet, NY (US); James R. Grandusky, Waterford, NY (US); Jianfeng Chen, Ballston Lake, NY (US); Shichao Wang, Troy, NY (US); Toru Kimura, Tokyo (JP); Thomas Miebach, Malta, NY (US); Keisuke Yamaoka, Tokyo (JP); Leo J. Schowalter, Latham, NY (US)

(72) Inventors: Robert T. Bondokov, Watervliet, NY (US); James R. Grandusky, Waterford, NY (US); Jianfeng Chen, Ballston Lake, NY (US); Shichao Wang, Troy, NY (US); Toru Kimura, Tokyo (JP); Thomas Miebach, Malta, NY (US); Keisuke Yamaoka, Tokyo (JP); Leo J. Schowalter, Latham, NY (US)

(73) Assignee: CRYSTAL IS, INC., Green Island, NY (US)

(*) Notice: Subject to any disclaimer, the term of this patent is extended or adjusted under 35 U.S.C. 154(b) by 0 days.

(21) Appl. No.: 18/080,008

(22) Filed: Dec. 13, 2022

(65) Prior Publication Data

US 2023/0183883 A1 Jun. 15, 2023

Related U.S. Application Data

(63) Continuation of application No. 16/444,147, filed on Jun. 18, 2019, now Pat. No. 11,555,256.

(Continued)

(51) Int. Cl.
*C30B 29/40* (2006.01)
*C01B 21/072* (2006.01)
(Continued)

(52) U.S. Cl.
CPC .......... *C30B 29/403* (2013.01); *C30B 23/066* (2013.01); *C30B 33/02* (2013.01);
(Continued)

(58) Field of Classification Search
CPC ... C01P 2006/60; C01B 21/072; C01B 21/00; C30B 29/403; C30B 23/066; C30B 33/02; H01L 33/32
(Continued)

(56) References Cited

U.S. PATENT DOCUMENTS 10,954,608 B2 3/2021 Bondokov et al.
11,168,411 B2 11/2021 Bondokov et al.
(Continued)

FOREIGN PATENT DOCUMENTS

JP 2012188344 A * 10/2012
JP 2017212452 A * 11/2017

OTHER PUBLICATIONS

Machine translation of JP-2012188344-A originally published Oct. 2012 to Koketsu et al. (Year: 2012).*
(Continued)

*Primary Examiner* — Colin W. Slifka
*Assistant Examiner* — Ritu S Shirali
(74) *Attorney, Agent, or Firm* — Morgan, Lewis & Bockius LLP

(57) ABSTRACT

In various embodiments, single-crystal aluminum nitride boules and substrates have low Urbach energies and/or absorption coefficients at deep-ultraviolet wavelengths. The single-crystal aluminum nitride may function as a platform for the fabrication of light-emitting devices such as light-
(Continued)

emitting diodes and lasers. The single-crystal aluminum nitride boules may advantageously have diameters that increase along at least portions of their lengths.

25 Claims, 17 Drawing Sheets

Related U.S. Application Data

(60) Provisional application No. 62/686,883, filed on Jun. 19, 2018.

(51) Int. Cl.
    *C30B 23/06*     (2006.01)
    *C30B 33/02*     (2006.01)
    *H01L 33/32*     (2010.01)

(52) U.S. Cl.
    CPC ............ *H01L 33/32* (2013.01); *C01B 21/072* (2013.01); *C01P 2006/60* (2013.01)

(58) Field of Classification Search
    USPC ........................................................ 423/412
    See application file for complete search history.

(56) References Cited

U.S. PATENT DOCUMENTS

| | | |
|---|---|---|
| 2005/0070421 A1 | 3/2005 | Kanechika et al. |
| 2012/0000414 A1* | 1/2012 | Bondokov ............ C30B 23/002 118/724 |
| 2012/0039789 A1 | 2/2012 | Katou et al. |
| 2013/0152852 A1* | 6/2013 | Bondokov ............ C30B 29/403 117/88 |
| 2015/0218729 A1 | 8/2015 | Schujman et al. |
| 2015/0247260 A1 | 9/2015 | Koukitu et al. |
| 2019/0229237 A1* | 7/2019 | Kinoshita ............. C30B 29/403 |
| 2019/0382919 A1 | 12/2019 | Bondokov et al. |

OTHER PUBLICATIONS

Machine translation of JP-2017212452-A originally published Nov. 2017 to Nagase et al. (Year: 2017).*
Bondokov, et al., "Large-area AlN substrates for electronic applications: An industrial perspective", 2008, Journal of Crystal Growth, vol. 310, pp. 4020-4026 (Year: 2008).
Chen, et al.,"Epitaxial growth and optical properties of Al- and N-polar AlN films by laser molecular beam epitaxy", 2014, Journal of Physics D: Applied Physics, vol. 47, pp. 1-7 (Year: 2014).
Hartmann, C., et al., "Preparation of deep UV transparent AlN substrates with high structural perfection for pptoelectronic devices", CrystEngComm, 2016, vol. 18, pp. 3488-3497.
Herro, Z.G., et al., "Growth of AlN single crystalline boules", Journal of Crystal Growth, 2010, vol. 312, Issue 18, pp. 2519-2521.
International Search Report and Written Opinion for International Application No. PCT/US2019/037626 dated Oct. 11, 2019, 9 pages.
Physics and Radio-Electronics: Light Emitting Diode (LED) [online], [retrieved on Feb. 8, 2022]. Retrieved from the internet: < URL: https://www.physics-and-radio-electronics.conn/electronic-devices-and- circuits/senniconductor-diodes/ lightemit-tingdiodeledconstructionworking.html#> (Year: 2022).
World Health Organization: Radiation: Ultraviolet (UV) radiation [online], 2016, [retrieved on Feb. 8, 2022]. Retrieved from the internet: < URL: https://www.who.int/news-roonn/questions-and-answers/itenn/radiation- ultraviolet-(uv)#:-:text=The UV region cover the, (100-180 nm) %.
Wu, et al., "Growth of conductive and insulative highly-orientated aluminum nitride thin films using laser molecular beam epitaxy", 2012, Diamond & Related Materials, vol. 25, pp. 139-143 (Year: 2012).

* cited by examiner

ALUMINUM NITRIDE CRYSTALS HAVING LOW URBACH ENERGY AND HIGH TRANSPARENCY TO DEEP-ULTRAVIOLET WAVELENGTHS

RELATED APPLICATIONS

This application is a continuation of U.S. patent application Ser. No. 16/444,147, filed Jun. 18, 2019, which claims the benefit of and priority to U.S. Provisional Patent Application No. 62/686,883, filed Jun. 19, 2018, the entire disclosure of each of which is hereby incorporated herein by reference.

TECHNICAL FIELD

In various embodiments, the present invention relates to single-crystal aluminum nitride (AlN) having high transparency at deep-ultraviolet wavelengths.

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of low-defect single crystals of AlN.

To make single-crystal AlN substrates more readily available and cost-effective, and to make the devices built thereon commercially feasible, it is desirable to grow AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. No. 6,770,135 (the '135 patent), U.S. Pat. No. 7,638,346 (the '346 patent), U.S. Pat. No. 7,776,153 (the '153 patent), and U.S. Pat. No. 9,028,612 (the '612 patent), the entire disclosures of which are incorporated by reference herein, describe various aspects of sublimation-recondensation growth of AlN, both seeded and unseeded.

While AlN substrates are enabling platforms for the fabrication of UV light-emitting devices such as LEDs, their performance in such applications is often limited by their transparency to UV light (i.e., "UV transparency") or lack thereof. AlN substrates with high UV transparency are often difficult to produce, as UV transparency is compromised by contamination and/or point defects introduced during the AlN growth process. Such issues have been addressed on a limited basis via techniques disclosed in U.S. Pat. Nos. 8,012,257, 9,034,103, and 9,447,519, the entire disclosure of each of which is incorporated herein by reference. Specifically, these patents disclose techniques for controlling the introduction of oxygen impurities during polycrystalline AlN source-material preparation and sublimation-recondensation growth of single-crystal AlN. While such techniques were reported as enabling production of bulk AlN crystals having low absorption coefficients, and thus high UV transparency, it has been found by the present inventors that such techniques fail to adequately address UV transparency at deep-UV wavelengths, i.e., wavelengths ranging from approximately 210 nm to approximately 280 nm. Relatedly, these patents contemplate the use of carbon as a dopant species in single-crystal AlN, and carbon has been more recently recognized as an impurity causing high levels of UV absorption, particularly at wavelengths around 265 nm.

For example, FIG. 6 of U.S. Pat. No. 9,447,519 (the '519 patent), reproduced here as FIG. 1A, depicts an absorption spectrum of an AlN crystal produced utilizing the oxygen-control techniques and controlled post-growth cooling described in the '519 patent. That AlN crystal had an absorption coefficient below about 10 cm$^{-1}$ for the wavelength range between 300 nm and 350 nm. However, as FIG. 1A illustrates, the absorption coefficient of the AlN crystal rose to values well above 10 cm$^{-1}$ for wavelengths below about 300 nm, and the slope of the absorption coefficient near the band edge was relatively gentle or gradual, resulting in non-uniform absorption behavior at low wavelengths near the band edge.

Moreover, while oxygen and carbon are recognized as impurities contributing to deleterious UV absorption in AlN, there are practical limits to the amount of such impurities that may be eliminated from single-crystal AlN.

In view of the foregoing, there is a need for AlN single crystals having low UV absorption coefficients at deep UV wavelengths, as well as techniques for fabricating such crystals.

SUMMARY

In various embodiments of the present invention, production of highly UV-transparent single crystals of AlN is enabled via vapor-phase growth, impurity control, post-growth temperature control within the growth system, and post-growth annealing techniques that are isothermal or quasi-isothermal. The resulting single-crystal AlN advantageously exhibits a low UV absorption coefficient (e.g., below 10 cm$^{-1}$, or even below 8 cm$^{-1}$) for wavelengths between 230 nm and 280 nm, or, in various embodiments, for wavelengths between 210 nm and 280 nm. The single-crystal AlN may also desirably exhibit a substantially "flat" UV absorption spectrum for wavelengths between 210 nm and 280 nm, e.g., a UV absorption coefficient that is substantially constant within that wavelength range (or a portion thereof), e.g., constant within ±3 cm$^{-1}$, ±2 cm$^{-1}$, or even 1 cm$^{-1}$. Such a spectrum may facilitate the engineering and improved performance of optical devices (e.g., light-emitting devices such as light-emitting diodes and lasers), as the optical performance of the AlN single-crystal substrate for such devices will exhibit substantially constant optical properties over the deep-UV wavelength range.

Moreover, AlN single crystals in accordance with embodiments of the invention exhibit steep slopes (i.e., "drop-offs") in their UV absorption spectra near the band edge of AlN, e.g., for wavelengths between approximately 210 nm and approximately 230 nm. This property advantageously contributes to the low UV absorption at deep-UV wavelengths and contributes to more uniform optical performance of substrates fabricated from the AlN crystals, as well as optical devices fabricated thereon.

Furthermore, annealing techniques in accordance with embodiments of the present invention advantageously do not require the elimination of carbon and oxygen from the single-crystal AlN to unreasonably low, impractical levels. Specifically, embodiments of the invention successfully result in low UV absorption at deep-UV wavelengths even for AlN crystals having oxygen and/or carbon concentrations ranging from approximately $10^{18}$ cm$^{-3}$ to approximately $10^{19}$ cm$^{-3}$. In addition, post-growth annealing techniques in accordance with embodiments of the invention may be coupled with high-rate cooling of the AlN crystal within the growth apparatus to, for example, avoid cracking of the crystal, even when such cooling techniques result in the AlN crystal initially exhibiting high levels of UV absorption at certain wavelengths.

As mentioned above, the presence of carbon impurities can lead to high levels of UV absorption in AlN crystals. Carbon incorporation leads to UV absorption at wavelengths around 265 nm, which can hinder the performance of UV light-emitting devices. (In the '519 patent, control of carbon incorporation was not explicitly contemplated, as carbon was suggested as both a possible dopant and crucible material for AlN fabrication.) In addition, oxygen impurities (or related point defects) typically result in UV absorption at wavelengths around 310 nm. Thus, while control of oxygen contamination is desirable for UV transparency, it is not sufficient to enable UV transparency at many UV wavelengths, particularly those in the deep-UV portion of the optical spectrum. Embodiments of the present invention include techniques for the improvement of UV absorption in AlN single crystals even when oxygen and/or carbon impurity concentrations have been controlled during the AlN fabrication process.

In accordance with embodiments of the present invention, single-crystal AlN may be fabricated via sublimation-recondensation from polycrystalline AlN source material that may have oxygen and/or carbon concentrations ranging from approximately $10^{18}$ cm$^{-3}$ to approximately $10^{19}$ cm$^{-3}$, or even approximately $10^{18}$ cm$^{-3}$ or less. As described in the '135 patent, the '346 patent, the '153 patent, and the '612 patent, the sublimation-recondensation growth process is desirably performed under a steep axial (i.e., in the direction of crystal growth away from a seed, if a seed is present) temperature gradient, while radial temperature gradients may be utilized to control the diameter of the growing crystal and influence its crystalline quality. In various embodiments of the present invention, the radial and/or axial thermal gradients within the crystal-growth crucible utilized to promote and control the growth of the AlN material may be controlled in various different manners. For example, individual heating elements arranged around the crucible may be powered to different levels (and thus different temperatures) to establish thermal gradients within the crucible. In addition or instead, thermal insulation may be selectively arranged around the crucible such that thinner and/or less insulating insulation is positioned around areas of higher desired temperature. As detailed in the '612 patent, thermal shields may also be arranged around the crucible, e.g., above and/or below the crucible, in any of a multitude of different arrangements in order to establish desired thermal gradients within the crucible.

The high radial and axial thermal gradients utilized during crystal growth necessarily result in the crystal being formed in a non-isothermal environment. While the thermal gradients enable the formation of large, high-quality AlN crystals, the arrangements of thermal shields, insulation, and related aspects of the growth system responsible for the formation of the thermal gradients during crystal growth also necessarily result in thermal gradients in the growth system during cool-down of the crystal after crystal growth. While various references, including the '519 patent, recommend cooling the as-grown crystal within the growth apparatus at a fairly slow rate in order to control point-defect formation, such slow cooling may result in cracking of the AlN crystal due to thermal-expansion mismatch, particularly for larger AlN crystals (e.g., crystals exceeding approximately 50 mm in diameter). Thus, embodiments of the present invention include cooling the as-grown AlN crystal to approximately room temperature (e.g., approximately 25° C.) within the growth chamber at a high cooling rate (e.g., exceeding 250° C./hour, 300° C./hour, 400° C./hour, or even 500° C./hour) in contradiction of the conventional wisdom and despite concomitant deleterious effects on the UV transparency of the crystal. The cooling from the growth temperature may also be performed without any additional applied heat from the heating elements of the growth system (e.g., applied to decrease the cooling rate, known as "controlled cooling"). The cooling of the crystal may be performed at a rate limited only by, e.g., the thermal mass of the growth system, and steps may be taken to accelerate the cooling of the crystal. For example, after growth the AlN crystal may be moved away from or out of the "hot zone" of the growth system (i.e., the portion of the growth system directly proximate and heated by the heating elements or furnace), and/or gas (e.g., nitrogen gas and/or an inert gas such as argon) may be flowed (e.g., at a flow rate higher than any flow rate utilized during crystal growth) within the system to increase the cooling rate.

After formation of the AlN single crystal and cooling from the growth temperature, the resulting crystal (or a portion thereof, e.g., a wafer or substrate separated from a crystalline boule) is placed within a high-temperature annealing furnace and annealed under isothermal, or quasi-isothermal, conditions to ensure substantially even heating of the entire crystal. (As utilized herein, "quasi-isothermal" conditions within a furnace correspond to the temperature within the furnace (or a dedicated heating area or "hot zone" thereof) being constant within ±5° C., ±2° C., ±1° C., or even ±0.5° C., and/or to any temperature gradient in any direction within the furnace (or a dedicated heating area or hot zone thereof) being less than 5° C./cm, less than 2° C./cm, less than 1° C./cm, or even less than 0.5° C./cm; such temperature gradients may be at least 0.05° C. or at least 0.1° C. in various embodiments). That is, the annealing conditions are preferably quite different from those under which the AlN crystal is initially grown and cooled within the crystal-growth crucible and growth system, which are desirably configured to create axial and/or radial thermal gradients therewithin. For example, the crystal may be annealed within a resistively heated or RF-heated furnace configured for isothermal annealing, rather than within the growth apparatus in which it was initially grown. After annealing, the annealed crystal is slowly and controllably cooled from the annealing temperature, for at least a portion of the temperature range between the annealing temperature and room temperature, in order to maintain the low UV absorption achieved within the annealing cycle. In various embodiments, the crystal is not attached or adhered to any part of the furnace during annealing and/or cooling (e.g., unlike during crystal growth, during which the crystal is attached to the crystal-growth crucible, for example, via a seed crystal).

Although embodiments of the invention have been presented herein utilizing AlN as the exemplary crystalline material fabricated in accordance therewith, embodiments of the invention may also be applied to other crystalline materials such as silicon carbide (SiC) and zinc oxide (ZnO); thus, herein, all references to AlN herein may be replaced, in other embodiments, by SiC or ZnO. As utilized herein, the term "diameter" refers to a lateral dimension (e.g., the largest lateral dimension) of a crystal, growth chamber, or other object, even if the crystal, growth chamber, or other object is not circular and/or is irregular in cross-section.

As utilized herein, a "substrate" or a "wafer" is a portion of a previously grown crystalline boule having top and bottom opposed, generally parallel surfaces. Boules (and generally, "single crystals" or "bulk crystals" as referred to herein) are three-dimensional bulk crystals (as opposed to, e.g., powder particles or needle-like, acicular crystallites). Substrates typically have thicknesses ranging between 200 μm and 1 mm and may be utilized as platforms for the epitaxial growth of semiconductor layers and the fabrication of semiconductor devices (e.g., light-emitting devices such as lasers and light-emitting diodes, transistors, power devices, etc.) thereon. As utilized herein, "room temperature" is 25° C.

In an aspect, embodiments of the invention feature an AlN single crystal having an Urbach energy ranging from approximately 0.2 eV to approximately 1.8 eV within an incident photon energy range of 5.85 eV to 6.0 eV. The Urbach energy $E_u$ is defined by $$\ln\alpha = \ln\alpha_0 + \left(\frac{h\nu}{E_U}\right).$$

α is an absorption coefficient of the AlN single crystal at an incident photon energy hv, and $\alpha_0$ is a constant corresponding to the absorption coefficient at zero photon energy.

Embodiments of the invention may include one or more of the following in any of a variety of combinations. The Urbach energy may range from approximately 0.21 eV to approximately 1.0 eV. The AlN single crystal may be a substrate having a diameter of at least approximately 25 mm. The diameter may be at least approximately 50 mm. The diameter may be at least approximately 60 mm, at least approximately 65 mm, at least approximately 70 mm, at least approximately 75 mm, at least approximately 80 mm, at least approximately 85 mm, at least approximately 90 mm, at least approximately 95 mm, or at least approximately 100 mm. The diameter may be no greater than approximately 150 mm, no greater than approximately 125 mm, no greater than approximately 110 mm, or no greater than approximately 100 mm.

The thermal conductivity of the AlN single crystal may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN single crystal may be, at room temperature, approximately 400 W/m·K or less, approximately 350 W/m·K or less, or approximately 300 W/m·K or less. The AlN single crystal may be a substrate. A crystalline orientation of the AlN substrate may be substantially parallel to a c-axis. A crystalline orientation of the AlN substrate may be angled at least approximately 10° relative to a c-axis, at least approximately 12° relative to a c-axis, at least approximately 15° relative to a c-axis, or at least approximately 20° relative to a c-axis. A crystalline orientation of the AlN substrate may be angled at most approximately 30° relative to a c-axis, at most approximately 25° relative to a c-axis, at most approximately 20° relative to a c-axis, or at most approximately 15° relative to a c-axis.

A density of threading edge dislocations in the AlN single crystal may be less than $5\times10^5$ cm$^{-2}$, less than $1\times10^5$ cm$^{-2}$, less than $5\times10^4$ cm$^{-2}$, less than $1\times10^4$ cm$^{-2}$, less than $5\times10^3$ cm$^{-2}$, or less than $1\times10^3$ cm$^{-2}$. A density of threading edge dislocations in the AlN single crystal may be more than 10 cm$^{-2}$, more than 100 cm$^{-2}$, more than 500 cm$^{-2}$, or more than 1000 cm$^{-2}$. A density of threading screw dislocations in the AlN single crystal may be less than 100 cm$^{-2}$, less than 50 cm$^{-2}$, less than 10 cm$^{-2}$, less than 5 cm$^{-2}$, or less than 1 cm$^{-2}$. A density of threading screw dislocations in the AlN single crystal may be more than 0.1 cm$^{-2}$, more than 0.5 cm$^{-2}$, more than 1 cm$^{-2}$, more than 2 cm$^{-2}$, or more than 5 cm$^{-2}$.

A silicon concentration of the AlN single crystal may be less than $1\times10^{19}$ cm$^{-3}$, less than $5\times10^{18}$ cm$^{-3}$, less than $1\times10^{18}$ cm$^{-3}$, less than $5\times10^{17}$ cm$^{-3}$, less than $3\times10^{17}$ cm$^{-3}$, less than $1\times10^{17}$ cm$^{-3}$, less than $5\times10^{16}$ cm$^{-3}$, or less than $1\times10^{16}$ cm$^{-3}$. A silicon concentration of the AlN single crystal may be more than $1\times10^{14}$ cm$^{-3}$, more than $5\times10^{14}$ cm$^{-3}$, more than $1\times10^{15}$ cm$^{-3}$, more than $5\times10^{15}$ cm$^{-3}$, more than $1\times10^{16}$ cm$^{-3}$, more than $5\times10^{16}$ cm$^{-3}$, or more than $1\times10^{17}$ cm$^{-3}$. An oxygen concentration of the AlN single crystal may be less than $1\times10^{19}$ cm$^{-3}$, less than $5\times10^{18}$ cm$^{-3}$, less than $1\times10^{18}$ cm$^{-3}$, less than $5\times10^{17}$ cm$^{3}$, less than $3\times10^{17}$ cm$^{3}$, less than $1\times10^{17}$ cm$^{3}$, less than $5\times10^{16}$ cm$^{-3}$, or less than $1\times10^{16}$ cm$^{-3}$. An oxygen concentration of the AlN single crystal may be more than $1\times10^{14}$ cm$^{-3}$, more than $5\times10^{14}$ cm$^{-3}$, more than $1\times10^{15}$ cm$^{-3}$, more than $5\times10^{15}$ cm$^{-3}$, more than $1\times10^{16}$ cm$^{-3}$, more than $5\times10^{16}$ cm$^{-3}$, or more than $1\times10^{17}$ cm$^{-3}$. A carbon concentration of the AlN single crystal may be less than $1\times10^{19}$ cm$^{-3}$, less than $5\times10^{18}$ cm$^{-3}$, less than $1\times10^{18}$ cm$^{3}$, less than $5\times10^{17}$ cm$^{3}$, less than $3\times10^{17}$ cm$^{3}$, less than $1\times10^{17}$ cm$^{-3}$, less than $5\times10^{16}$ cm$^{-3}$, or less than $1\times10^{16}$ cm$^{-3}$. A carbon concentration of the AlN single crystal may be more than $1\times10^{14}$ cm$^{-3}$, more than $5\times10^{14}$ cm$^{-3}$, more than $1\times10^{15}$ cm$^{-3}$, more than $5\times10^{15}$ cm$^{-3}$, more than $1\times10^{16}$ cm$^{-3}$, more than $5\times10^{16}$ cm$^{-3}$, or more than $1\times10^{17}$ cm$^{-3}$. The ratio of the carbon concentration of the AlN single crystal to the oxygen concentration of the AlN single crystal may be less than 1, less than 0.9, less than 0.8, less than 0.7, less than 0.6, less than 0.5, less than 0.4, or less than 0.3. The ratio of the carbon concentration of the AlN single crystal to the oxygen concentration of the AlN single crystal may be more than 0.1, more than 0.2, more than 0.3, or more than 0.4.

An ultraviolet (UV) absorption coefficient of the AlN single crystal may be less than 10 cm$^{-1}$ for an entire wavelength range of 220 nm to 280 nm (i.e., for each wavelength within the range of 220 nm to 280 nm). The UV absorption coefficient may be no less than approximately 5 cm$^{-1}$ for the entire wavelength range of 220 nm to 280 nm. The UV absorption coefficient may be constant within ±2 cm$^{-1}$ for the entire wavelength range of 220 nm to 280 nm. The UV absorption coefficient may be constant within ±1 cm$^{-1}$ for the entire wavelength range of 220 nm to 280 nm. A UV absorption coefficient of the AlN single crystal may be less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. A UV absorption coefficient of the AlN single crystal may be less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. A UV absorption coefficient of the AlN single crystal may be less than 20 cm$^{-1}$ for an entire wavelength range of 215 nm to 220 nm. The UV absorption coefficient may be less than 15 cm$^{-1}$ for a wavelength of 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. A UV absorption coefficient of the AlN single crystal may be less than 15 cm$^{-1}$ for an entire wavelength range of 220 nm to 240 nm. The UV absorption coefficient may be less than 15 cm$^{-1}$ for an entire wavelength range of 220 nm to 230 nm. The UV absorption coefficient may be less than 10 cm$^{-1}$ for a wavelength of 230 nm. The UV absorption coefficient may be no less than approximately 5 cm$^{-1}$ for the entire wavelength range of 220 nm to 240 nm. A light-emitting device may be disposed on or over the AlN single crystal. The light-emitting device may include, consist essentially of, or consist of a light-emitting diode and/or a laser. The light-emitting device may be configured to emit ultraviolet light.

In another aspect, embodiments of the invention feature an AlN single crystal having an ultraviolet (UV) absorption coefficient of less than 10 cm$^{-1}$ for an entire wavelength range of 220 nm to 280 nm.

Embodiments of the invention may include one or more of the following in any of a variety of combinations. The UV absorption coefficient may be no less than approximately 5 cm$^{-1}$ for the entire wavelength range of 220 nm to 280 nm. The AlN single crystal may be a substrate having a diameter of at least approximately 25 mm. The diameter may be at least approximately 50 mm. The diameter may be at least approximately 60 mm, at least approximately 65 mm, at least approximately 70 mm, at least approximately 75 mm, at least approximately 80 mm, at least approximately 85 mm, at least approximately 90 mm, at least approximately 95 mm, or at least approximately 100 mm. The diameter may be no greater than approximately 150 mm, no greater than approximately 125 mm, no greater than approximately 110 mm, or no greater than approximately 100 mm.

The thermal conductivity of the AlN single crystal may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN single crystal may be, at room temperature, approximately 400 W/m·K or less, approximately 350 W/m·K or less, or approximately 300 W/m·K or less. The AlN single crystal may be a substrate. A crystalline orientation of the AlN substrate may be substantially parallel to a c-axis. A crystalline orientation of the AlN substrate may be angled at least approximately 10° relative to a c-axis, at least approximately 12° relative to a c-axis, at least approximately 15° relative to a c-axis, or at least approximately 20° relative to a c-axis. A crystalline orientation of the AlN substrate may be angled at most approximately 30° relative to a c-axis, at most approximately 25° relative to a c-axis, at most approximately 20° relative to a c-axis, or at most approximately 15° relative to a c-axis.

A density of threading edge dislocations in the AlN single crystal may be less than 5×10$^5$ cm$^{-2}$, less than 1×10$^5$ cm$^{-2}$, less than 5×10$^4$ cm$^{-2}$, less than 1×10$^4$ cm$^{-2}$, less than 5×10$^3$ cm$^{-2}$, or less than 1×10$^3$ cm$^{-2}$. A density of threading edge dislocations in the AlN single crystal may be more than 10 cm$^{-2}$, more than 100 cm$^{-2}$, more than 500 cm$^{-2}$, or more than 1000 cm$^{-2}$. A density of threading screw dislocations in the AlN single crystal may be less than 100 cm$^{-2}$, less than 50 cm$^{-2}$, less than 10 cm$^{-2}$, less than 5 cm$^{-2}$, or less than 1 cm$^{-2}$. A density of threading screw dislocations in the AlN single crystal may be more than 0.1 cm$^{-2}$, more than 0.5 cm$^{-2}$, more than 1 cm$^{-2}$, more than 2 cm$^{-2}$, or more than 5 cm$^{-2}$.

A silicon concentration of the AlN single crystal may be less than 1×10$^{19}$ cm$^{-3}$, less than 5×10$^{18}$ cm$^3$, less than 1×10$^{18}$ cm$^3$, less than 5×10$^{17}$ cm$^3$, less than 3×10$^{17}$ cm$^3$, less than 1×10$^{17}$ cm$^{-3}$, less than 5×10$^{16}$ cm$^{-3}$, or less than 1×10$^{16}$ cm$^{-3}$. A silicon concentration of the AlN single crystal may be more than 1×10$^{14}$ cm$^{-3}$, more than 5×10$^{14}$ cm$^{-3}$, more than 1×10$^{15}$ cm$^{-3}$, more than 5×10$^{15}$ cm$^{-3}$, more than 1×10$^{16}$ cm$^{-3}$, more than 5×10$^{16}$ cm$^{-3}$, or more than 1×10$^{17}$ cm$^{-3}$. An oxygen concentration of the AlN single crystal may be less than 1×10$^{19}$ cm$^{-3}$, less than 5×10$^{18}$ cm$^{-3}$, less than 1×10$^{18}$ cm$^{-3}$, less than 5×10$^{17}$ cm$^{-3}$, less than 3×10$^{17}$ cm$^{-3}$, less than 1×10$^{17}$ cm$^{-3}$, less than 5×10$^{16}$ cm$^{-3}$, or less than 1×10$^{16}$ cm$^{-3}$. An oxygen concentration of the AlN single crystal may be more than 1×10$^{14}$ cm$^{-3}$, more than 5×10$^{14}$ cm$^{-3}$, more than 1×10$^{15}$ cm$^{-3}$, more than 5×10$^{15}$ cm$^{-3}$, more than 1×10$^{16}$ cm$^{-3}$, more than 5×10$^{16}$ cm$^{-3}$, or more than 1×10$^{17}$ cm$^{-3}$. A carbon concentration of the AlN single crystal may be less than 1×10$^{19}$ cm$^{-3}$, less than 5×10$^{18}$ cm$^{-3}$, less than 1×10$^{18}$ cm$^{-3}$, less than 5×10$^{17}$ cm$^{-3}$, less than 3×10$^{17}$ cm$^{-3}$, less than 1×10$^{17}$ cm$^{-3}$, less than 5×10$^{16}$ cm$^{-3}$, or less than 1×10$^{16}$ cm$^{-3}$. A carbon concentration of the AlN single crystal may be more than 1×10$^{14}$ cm$^{-3}$, more than 5×10$^{14}$ cm$^{-3}$, more than 1×10$^{15}$ cm$^{-3}$, more than 5×10$^{15}$ cm$^{-3}$, more than 1×10$^{16}$ cm$^{-3}$, more than 5×10$^{16}$ cm$^{-3}$, or more than 1×10$^{17}$ cm$^{-3}$. The ratio of the carbon concentration of the AlN single crystal to the oxygen concentration of the AlN single crystal may be less than 1, less than 0.9, less than 0.8, less than 0.7, less than 0.6, less than 0.5, less than 0.4, or less than 0.3. The ratio of the carbon concentration of the AlN single crystal to the oxygen concentration of the AlN single crystal may be more than 0.1, more than 0.2, more than 0.3, or more than 0.4.

The UV absorption coefficient may be constant within ±2 cm$^{-1}$ for the entire wavelength range of 220 nm to 280 nm. The UV absorption coefficient may be constant within ±1 cm$^{-1}$ for the entire wavelength range of 220 nm to 280 nm. The UV absorption coefficient may be less than 30 cm$^{-1}$ for an entire wavelength range of 210 nm to 218 nm. The UV absorption coefficient may be less than 8 cm$^{-1}$ for an entire wavelength range of 240 nm to 280 nm. The UV absorption coefficient may be less than 20 cm$^{-1}$ for an entire wavelength range of 215 nm to 218 nm. The UV absorption coefficient may be less than 15 cm$^{-1}$ for a wavelength of 218 nm. A light-emitting device may be disposed on or over the AlN single crystal. The light-emitting device may include, consist essentially of, or consist of a light-emitting diode and/or a laser. The light-emitting device may be configured to emit ultraviolet light.

In yet another aspect, embodiments of the invention feature an AlN single crystal having an ultraviolet (UV) absorption coefficient of less than 30 cm$^{-1}$ for an entire wavelength range of 210 nm to 220 nm.

Embodiments of the invention may include one or more of the following in any of a variety of combinations. The UV absorption coefficient may be no less than approximately 5 cm$^{-1}$ for the entire wavelength range of 210 nm to 220 nm. The UV absorption coefficient may be no less than approximately 10 cm$^{-1}$ for the entire wavelength range of 210 nm to 220 nm. The AlN single crystal may be a substrate having a diameter of at least approximately 25 mm. The diameter may be at least approximately 50 mm. The diameter may be at least approximately 60 mm, at least approximately 65 mm, at least approximately 70 mm, at least approximately 75 mm, at least approximately 80 mm, at least approximately 85 mm, at least approximately 90 mm, at least approximately 95 mm, or at least approximately 100 mm. The diameter may be no greater than approximately 150 mm, no greater than approximately 125 mm, no greater than approximately 110 mm, or no greater than approximately 100 mm.

The thermal conductivity of the AlN single crystal may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN single crystal may be, at room temperature, approximately 400 W/m·K or less, approximately 350 W/m·K or less, or approximately 300 W/m·K or less. The AlN single crystal may be a substrate. A crystalline orientation of the AlN substrate may be substantially parallel to a c-axis. A crystalline orientation of the AlN substrate may be angled at least approximately 10° relative to a c-axis, at least approximately 12° relative to a c-axis, at least approximately 15° relative to a c-axis, or at least approximately 20° relative to a c-axis. A crystalline orientation of the AlN substrate may be angled at most approximately 30° relative to a c-axis, at most approximately 25° relative to a c-axis, at most approximately 20° relative to a c-axis, or at most approximately 15° relative to a c-axis.

A density of threading edge dislocations in the AlN single crystal may be less than $5\times10^5$ cm$^{-2}$, less than $1\times10^5$ cm$^{-2}$, less than $5\times10^4$ cm$^{-2}$, less than $1\times10^4$ cm$^{-2}$, less than $5\times10^3$ cm$^{-2}$, or less than $1\times10^3$ cm$^{-2}$. A density of threading edge dislocations in the AlN single crystal may be more than 10 cm$^{-2}$, more than 100 cm$^{-2}$, more than 500 cm$^{-2}$, or more than 1000 cm$^{-2}$. A density of threading screw dislocations in the AlN single crystal may be less than 100 cm$^{-2}$, less than 50 cm$^{-2}$, less than 10 cm$^{-2}$, less than 5 cm$^{-2}$, or less than 1 cm$^{-2}$. A density of threading screw dislocations in the AlN single crystal may be more than 0.1 cm$^{-2}$, more than 0.5 cm$^{-2}$, more than 1 cm$^{-2}$, more than 2 cm$^{-2}$, or more than 5 cm$^{-2}$.

A silicon concentration of the AlN single crystal may be less than $1\times10^{19}$ cm$^{-3}$, less than $5\times10^{18}$ cm$^{-3}$, less than $1\times10^{18}$ cm$^{-3}$, less than $5\times10^{17}$ cm$^{-3}$, less than $3\times10^{17}$ cm$^{-3}$, less than $1\times10^{17}$ cm$^{-3}$, less than $5\times10^{16}$ cm$^{-3}$, or less than $1\times10^{16}$ cm$^{-3}$. A silicon concentration of the AlN single crystal may be more than $1\times10^{14}$ cm$^{-3}$, more than $5\times10^{14}$ cm$^{-3}$, more than $1\times10^{15}$ cm$^{-3}$, more than $5\times10^{15}$ cm$^{-3}$, more than $1\times10^{16}$ cm$^{-3}$, more than $5\times10^{16}$ cm$^{-3}$, or more than $1\times10^{17}$ cm$^{-3}$. An oxygen concentration of the AlN single crystal may be less than $1\times10^{19}$ cm$^{-3}$, less than $5\times10^{18}$ cm$^{-3}$, less than $1\times10^{18}$ cm$^{-3}$, less than $5\times10^{17}$ cm$^{-3}$, less than $3\times10^{17}$ cm$^{-3}$, less than $1\times10^{17}$ cm$^{-3}$, less than $5\times10^{16}$ cm$^{-3}$, or less than $1\times10^{16}$ cm$^{-3}$. An oxygen concentration of the AlN single crystal may be more than $1\times10^{14}$ cm$^3$, more than $5\times10^{14}$ cm$^3$, more than $1\times10^{15}$ cm$^3$, more than $5\times10^{15}$ cm$^3$, more than $1\times10^{16}$ cm$^{-3}$, more than $5\times10^{16}$ cm$^{-3}$, or more than $1\times10^{17}$ cm$^{-3}$. A carbon concentration of the AlN single crystal may be less than $1\times10^{19}$ cm$^{-3}$, less than $5\times10^{18}$ cm$^{-3}$, less than $1\times10^{18}$ cm$^{-3}$, less than $5\times10^{17}$ cm$^{-3}$, less than $3\times10^{17}$ cm$^{-3}$, less than $1\times10^{17}$ cm$^{-3}$, less than $5\times10^{16}$ cm$^{-3}$, or less than $1\times10^{16}$ cm$^{-3}$. A carbon concentration of the AlN single crystal may be more than $1\times10^{14}$ cm$^{-3}$, more than $5\times10^{14}$ cm$^{-3}$, more than $1\times10^{15}$ cm$^{-3}$, more than $5\times10^{15}$ cm$^{-3}$, more than $1\times10^{16}$ cm$^{-3}$, more than $5\times10^{16}$ cm$^{-3}$, or more than $1\times10^{17}$ cm$^{-3}$. The ratio of the carbon concentration of the AlN single crystal to the oxygen concentration of the AlN single crystal may be less than 1, less than 0.9, less than 0.8, less than 0.7, less than 0.6, less than 0.5, less than 0.4, or less than 0.3. The ratio of the carbon concentration of the AlN single crystal to the oxygen concentration of the AlN single crystal may be more than 0.1, more than 0.2, more than 0.3, or more than 0.4.

The UV absorption coefficient may be less than 8 cm$^{-1}$ for an entire wavelength range of 240 nm to 280 nm. The UV absorption coefficient may be less than 20 cm$^{-1}$ for an entire wavelength range of 215 nm to 220 nm. The UV absorption coefficient may be less than 20 cm$^{-1}$ for a wavelength of 220 nm. The UV absorption coefficient may be less than 15 cm$^{-1}$ for an entire wavelength range of 220 nm to 240 nm. The UV absorption coefficient may be less than 15 cm$^{-1}$ for an entire wavelength range of 220 nm to 230 nm. The UV absorption coefficient may be less than 10 cm$^{-1}$ for a wavelength of 230 nm. A light-emitting device may be disposed on or over the AlN single crystal. The light-emitting device may include, consist essentially of, or consist of a light-emitting diode and/or a laser. The light-emitting device may be configured to emit ultraviolet light.

In another aspect, embodiments of the invention feature a light-emitting diode (LED) comprising a light-emitting device structure disposed over a single-crystal AlN substrate, configured to emit ultraviolet (UV) light at a wavelength (i.e., a primary wavelength and/or wavelength of greatest emission intensity) ranging from 228 nm to 238 nm, and having an external quantum efficiency ranging from 0.02% to 0.5%.

Embodiments of the invention may include one or more of the following in any of a variety of combinations. The AlN substrate may have an Urbach energy ranging from approximately 0.2 eV to approximately 1.8 eV within an incident photon energy range of 5.85 eV to 6.0 eV. The Urbach energy $E_u$ may be defined by:

$$\ln\alpha = \ln\alpha_0 + \left(\frac{h\nu}{E_U}\right),$$

where $\alpha$ is an absorption coefficient of the AlN single crystal at an incident photon energy hv, and $\alpha_0$ is a constant corresponding to the absorption coefficient at zero photon energy. The Urbach energy of the AlN substrate may range from approximately 0.21 eV to approximately 1.0 eV. The AlN substrate may have an ultraviolet (UV) absorption coefficient of less than 10 cm$^{-1}$ for an entire wavelength range of 220 nm to 280 nm. The UV absorption coefficient may be no less than approximately 5 cm$^{-1}$ for the entire wavelength range of 220 nm to 280 nm. The UV absorption coefficient may be constant within ±2 cm$^{-1}$ for the entire wavelength range of 220 nm to 280 nm. The UV absorption coefficient may be constant within ±1 cm$^{-1}$ for the entire wavelength range of 220 nm to 280 nm. The AlN substrate may have a UV absorption coefficient of less than 30 cm$^{-1}$ for an entire wavelength range of 210 nm to 220 nm. The UV absorption coefficient may be no less than approximately 5 cm$^{-1}$ for the entire wavelength range of 210 nm to 220 nm. The AlN substrate may have a UV absorption coefficient of less than 8 cm$^{-1}$ for an entire wavelength range of 240 nm to 280 nm. The UV absorption coefficient may be no less than approximately 5 cm$^{-1}$ for the entire wavelength range of 240 nm to 280 nm. The AlN substrate may have a UV absorption coefficient of less than 20 cm$^{-1}$ for an entire wavelength range of 215 nm to 220 nm. The UV absorption coefficient may be no less than approximately 5 cm$^{-1}$ for the entire wavelength range of 215 nm to 220 nm. The UV absorption coefficient may be no less than approximately 10 cm$^{-1}$ for the entire wavelength range of 215 nm to 220 nm. The AlN substrate may have a UV absorption coefficient of less than 20 cm$^{-1}$ for a wavelength of 220 nm. The UV absorption coefficient may be no less than approximately 5 cm$^{-1}$ for the wavelength of 220 nm. The AlN substrate may have a UV absorption coefficient of less than 15 cm$^{-1}$ for an entire wavelength range of 220 nm to 240 nm. The UV absorption coefficient may be no less than approximately 5 cm$^{-1}$ for the entire wavelength range of 220 nm to 240 nm. The AlN substrate may have a UV absorption coefficient of less than 15 cm$^{-1}$ for an entire wavelength range of 220 nm to 230 nm. The UV absorption coefficient may be no less than approximately 5 cm$^{-1}$ for the entire wavelength range of 220 nm to 230 nm. The AlN substrate may have a UV absorption coefficient of less than 10 cm$^{-1}$ for a wavelength of 230 nm. The UV absorption coefficient may be no less than approximately 5 cm$^{-1}$ for the wavelength of 230 nm.

The thermal conductivity of the AlN substrate may be, at room temperature, approximately 250 W/m·K or greater, approximately 270 W/m·K or greater, approximately 290 W/m·K or greater, approximately 300 W/m·K or greater, or approximately 320 W/m·K or greater. The thermal conductivity of the AlN substrate may be, at room temperature, approximately 400 W/m·K or less, approximately 350 W/m·K or less, or approximately 300 W/m·K or less. A crystalline orientation of the AlN substrate may be substantially parallel to a c-axis. A crystalline orientation of the AlN substrate may be angled at least approximately 10° relative to a c-axis, at least approximately 12° relative to a c-axis, at least approximately 15° relative to a c-axis, or at least approximately 20° relative to a c-axis. A crystalline orientation of the AlN substrate may be angled at most approximately 30° relative to a c-axis, at most approximately 25° relative to a c-axis, at most approximately 20° relative to a c-axis, or at most approximately 15° relative to a c-axis.

A density of threading edge dislocations in the AlN substrate may be less than 5×10$^5$ cm$^{-2}$, less than 1×10$^5$ cm$^{-2}$, less than 5×10$^4$ cm$^{-2}$, less than 1×10$^4$ cm$^{-2}$, less than 5×10$^3$ cm$^{-2}$, or less than 1×10$^3$ cm$^{-2}$. A density of threading edge dislocations in the AlN substrate may be more than 10 cm$^{-2}$, more than 100 cm$^{-2}$, more than 500 cm$^{-2}$, or more than 1000 cm$^{-2}$. A density of threading screw dislocations in the AlN substrate may be less than 100 cm$^{-2}$, less than 50 cm$^{-2}$, less than 10 cm$^{-2}$, less than 5 cm$^{-2}$, or less than 1 cm$^{-2}$. A density of threading screw dislocations in the AlN substrate may be more than 0.1 cm$^{-2}$, more than 0.5 cm$^{-2}$, more than 1 cm$^{-2}$, more than 2 cm$^{-2}$, or more than 5 cm$^{-2}$.

A silicon concentration of the AlN substrate may be less than 1×10$^{19}$ cm$^{-3}$, less than 5×10$^{18}$ cm$^{-3}$, less than 1×10$^{18}$ cm$^{-3}$, less than 5×10$^{17}$ cm$^{-3}$, less than 3×10$^{17}$ cm$^{-3}$, less than 1×10$^{17}$ cm$^{-3}$, less than 5×10$^{16}$ cm$^{-3}$, or less than 1×10$^{16}$ cm$^{-3}$. A silicon concentration of the AlN substrate may be more than 1×10$^{14}$ cm$^{-3}$, more than 5×10$^{14}$ cm$^{-3}$, more than 1×10$^{15}$ cm$^{-3}$, more than 5×10$^{15}$ cm$^{-3}$, more than 1×10$^{16}$ cm$^{-3}$, more than 5×10$^{16}$ cm$^{-3}$, or more than 1×10$^{17}$ cm$^{-3}$. An oxygen concentration of the AlN substrate may be less than 1×10$^{19}$ cm$^{-3}$, less than 5×10$^{18}$ cm$^{-3}$, less than 1×10$^{18}$ cm$^{-3}$, less than 5×10$^{17}$ cm$^{-3}$, less than 3×10$^{17}$ cm$^{-3}$, less than 1×10$^{17}$ cm$^{-3}$, less than 5×10$^{16}$ cm$^{-3}$, or less than 1×10$^{16}$ cm$^{-3}$. An oxygen concentration of the AlN substrate may be more than 1×10$^{14}$ cm$^{-3}$, more than 5×10$^{14}$ cm$^{-3}$, more than 1×10$^{15}$ cm$^{-3}$, more than 5×10$^{15}$ cm$^{-3}$, more than 1×10$^{16}$ cm$^{-3}$, more than 5×10$^{16}$ cm$^{-3}$, or more than 1×10$^{17}$ cm$^{-3}$. A carbon concentration of the AlN substrate may be less than 1×10$^{19}$ cm$^{-3}$, less than 5×10$^{18}$ cm$^{-3}$, less than 1×10$^{18}$ cm$^{-3}$, less than 5×10$^{17}$ cm$^{-3}$, less than 3×10$^{17}$ cm$^{-3}$, less than 1×10$^{17}$ cm$^{-3}$, less than 5×10$^{16}$ cm$^{-3}$, or less than 1×10$^{16}$ cm$^{-3}$. A carbon concentration of the AlN substrate may be more than 1×10$^{14}$ cm$^{-3}$, more than 5×10$^{14}$ cm$^{-3}$, more than 1×10$^{15}$ cm$^{-3}$, more than 5×10$^{15}$ cm$^{-3}$, more than 1×10$^{16}$ cm$^{-3}$, more than 5×10$^{16}$ cm$^{-3}$, or more than 1×10$^{17}$ cm$^{-3}$. The ratio of the carbon concentration of the AlN substrate to the oxygen concentration of the AlN substrate may be less than 1, less than 0.9, less than 0.8, less than 0.7, less than 0.6, less than 0.5, less than 0.4, or less than 0.3. The ratio of the carbon concentration of the AlN substrate to the oxygen concentration of the AlN substrate may be more than 0.1, more than 0.2, more than 0.3, or more than 0.4.

In yet another aspect, embodiments of the invention feature a polycrystalline AlN ceramic having (i) a width of at least approximately 0.5 cm and at most approximately 2 cm, and (ii) a carbon concentration of at most approximately 60 ppm.

Embodiments of the invention may include one or more of the following in any of a variety of combinations. The carbon concentration may be at least approximately 5 ppm. The carbon concentration may be between approximately 5 ppm and approximately 26 ppm. The polycrystalline AlN ceramic may have an oxygen concentration of less than 100 ppm. The polycrystalline AlN ceramic may contain less than 0.1% excess Al. A density of the polycrystalline AlN ceramic, as measured by pycnometry at room temperature, may range from approximately 3.25 g/cm$^3$ to approximately 3.26 g/cm$^3$. A density of the polycrystalline AlN ceramic, as measured by pycnometry at room temperature, may range from approximately 2.95 g/cm$^3$ to approximately 3.20 g/cm$^3$.

In an aspect, embodiments of the invention feature a method of improving ultraviolet (UV) transparency of a single-crystal AlN bulk crystal. The AlN bulk crystal is disposed within a heating chamber. Gas (e.g., nitrogen gas) is provided within the heating chamber at a pressure ranging from approximately 1 bar to approximately 2 bars. A temperature within the heating chamber is ramped to an annealing temperature at a ramp rate ranging from approximately 1° C./min to approximately 50° C./min. The annealing temperature ranges from approximately 2100° C. to approximately 2500° C. The AlN bulk crystal is annealed at the annealing temperature for a time period ranging from approximately 0.5 hour to approximately 5 hours. After annealing, the AlN bulk crystal is cooled via a cooling cycle. The cooling cycle includes, consists essentially of, or consists of (i) cooling the AlN bulk crystal from the annealing temperature to a first temperature ranging from 800° C. to 1250° C. over a time period ranging from 10 hours to 100 hours, and (ii) thereafter, cooling the AlN bulk crystal to approximately room temperature.

Embodiments of the invention may include one or more of the following in any of a variety of combinations. Before the AlN bulk crystal is disposed within the heating chamber, an oxygen concentration within the AlN bulk crystal may range between approximately 1×10$^{18}$ cm$^{-3}$ and approximately 1×10$^{19}$ cm$^{-3}$, and/or a carbon concentration within the AlN bulk crystal may range between approximately 1×10$^{18}$ cm$^{-3}$ and approximately 1×10$^{19}$ cm$^{-3}$. The interior of the heating chamber may include, consist essentially of, or consist of one or more refractory metals. The interior of the heating chamber may include, consist essentially of, or consist of W. Prior to disposing the AlN bulk crystal within the heating chamber, an interior of the heating chamber may be heated to a temperature no less than 2600° C. under a pressure of less than 1 bar. The interior of the heating chamber may be heated for a time ranging from approximately 0.5 hour to approximately 2 hours. The heating chamber may include, consist essentially of, or consist of a resistive furnace or a radio-frequency furnace.

The AlN bulk crystal may be annealed at the annealing temperature at least quasi-isothermally. Before the AlN bulk crystal is disposed within the heating chamber, the AlN bulk crystal may be grown within a crystal-growth chamber different from the heating chamber. A single-crystal AlN substrate having a diameter of at least 25 mm may be separated from the AlN bulk crystal. A light-emitting device may be fabricated over at least a portion of the AlN substrate. The light-emitting device may include, consist essentially of, or consist of a light-emitting diode and/or a laser. The light-emitting device may be configured to emit ultraviolet light. The AlN bulk crystal may include, consist essentially of, or consist of a single-crystal AlN substrate having a diameter of at least 25 mm. A light-emitting device may be fabricated over at least a portion of the AlN substrate. The light-emitting device may include, consist essentially of, or consist of a light-emitting diode and/or a laser. The light-emitting device may be configured to emit ultraviolet light.

Embodiments of the invention may include AlN boules, substrates, and/or light-emitting devices formed or formable in accordance with any of the above methods.

In another aspect, embodiments of the invention feature a method of forming single-crystal aluminum nitride (AlN). A bulk polycrystalline AlN ceramic is provided. At least a portion of the AlN ceramic is disposed into a first crucible. The at least a portion of the AlN ceramic is annealed and/or densified in the first crucible, thereby forming a polycrystalline AlN source. The annealing and/or densifying includes, consists essentially of, or consists of (i) heating the at least a portion of the AlN ceramic at a first temperature ranging from 1100° C. to 2000° C. for a first time ranging from 2 hours to 25 hours, and (ii) thereafter, heating the at least a portion of the AlN ceramic at a second temperature ranging from 1900° C. to 2250° C. for a second time ranging from 3 hours to 15 hours, the second temperature being greater than the first temperature, or (i) heating the at least a portion of the AlN ceramic during a temperature ramp to a third temperature ranging from 1900° C. to 2250° C. over a third time ranging from 5 hours to 25 hours, and (ii) thereafter, heating the at least a portion of the AlN ceramic at a fourth temperature ranging from 1900° C. to 2250° C. for a fourth time ranging from 3 hours to 25 hours. The AlN source is cooled to approximately room temperature. A second crucible containing the AlN source and a seed crystal is disposed within a furnace. The seed crystal may include, consist essentially of, or consist of single-crystal AlN. The second crucible is heated with the furnace to a growth temperature of at least 2000° C. The second crucible is maintained at the growth temperature for a soak time. The soak time may range from 1 hour to 10 hours. After the soak time, while the second crucible is at the growth temperature, (i) vapor including, consisting essentially of, or consisting of aluminum and nitrogen is condensed on the seed crystal, thereby forming a single-crystalline AlN boule extending from the seed crystal, and (ii) the second crucible is moved relative to the furnace. A growth rate of the AlN boule may be approximately equal to a rate of relative motion between the second crucible and the furnace. Thereafter, the AlN boule is cooled to approximately room temperature.

Embodiments of the invention may include one or more of the following in any of a variety of combinations. Before annealing and/or densifying, the at least a portion of the AlN ceramic may have (i) less than approximately 1% excess Al and/or (ii) an oxygen concentration less than $2 \times 10^{19}$ cm$^{-3}$. The first temperature may range from 1100° C. to 1900° C. The second temperature may range from 2000° C. to 2250° C. The third temperature may range from 2000° C. to 2250° C. The fourth temperature may range from 2000° C. to 2250° C.

The growth temperature may be approximately 2300° C. or less, approximately 2200° C. or less, or approximately 2100° C. or less. The diameter of at least a portion (or even all) of the AlN boule may be at least approximately 25 mm, at least approximately 35 mm, at least approximately 50 mm, at least approximately 75 mm, or at least approximately 100 mm. The diameter of at least a portion (or even all) of the AlN boule may be at most approximately 150 mm, at most approximately 125 mm, at most approximately 100 mm, or at most approximately 75 mm. The diameter of at least a portion (or even all) of the AlN boule may be approximately 50 mm.

Prior to disposing the at least a portion of the AlN ceramic into the first crucible, the AlN ceramic may be fragmented into fragments. One or more fragments may be selected as the at least a portion of the AlN ceramic. One or more (or even each) of the fragments may have a width (or diameter, or length, or other dimension) greater than approximately 0.1 cm, greater than approximately 0.2 cm, greater than approximately 0.3 cm, greater than approximately 0.4 cm, greater than approximately 0.5 cm, greater than approximately 0.7 cm, or greater than approximately 1 cm. One or more (or even each) of the fragments may have a width (or diameter, or length, or other dimension) less than approximately 5 cm, less than approximately 4 cm, less than approximately 3 cm, less than approximately 2 cm, less than approximately 1.5 cm, or less than approximately 1 cm. A crystalline orientation of the seed crystal may be substantially parallel to a c-axis. The first crucible and the second crucible may be the same crucible. The first crucible and the second crucible may be different crucibles.

The growth rate may be at least 0.1 mm/hour, at least 0.2 mm/hour, at least 0.3 mm/hour, at least 0.4 mm/hour, at least 0.5 mm/hour, at least 0.7 mm/hour, or at least 1 mm/hour. The growth rate may be at most 3 mm/hour, at most 2.5 mm/hour, at most 2 mm/hour, at most 1.5 mm/hour, or at most 1 mm/hour. The soak time may be at least approximately 2 hours, at least approximately 3 hours, at least approximately 4 hours, at least approximately 5 hours, at least approximately 8 hours, or at least approximately 10 hours. The soak time may be at most approximately 20 hours, at most approximately 18 hours, at most approximately 17 hours, at most approximately 16 hours, or at most approximately 15 hours. The soak time may be approximately 5 hours. The soak time may be approximately 5 hours. The soak time may be approximately 5-10 hours. The soak time may be approximately 1-5 hours. The diameter of the seed crystal may be approximately 25 mm or larger, approximately 30 mm or larger, approximately 35 mm or larger, approximately 40 mm or larger, approximately 45 mm or larger, or approximately 50 mm or larger. The diameter of the seed crystal may be approximately 150 mm or smaller, approximately 100 mm or smaller, approximately 75 mm or smaller, or approximately 50 mm or smaller.

The AlN boule may be sliced to form a single-crystal AlN substrate having a diameter of at least 25 mm, at least 30 mm, at least 35 mm, at least 40 mm, at least 45 mm, or at least 50 mm. The diameter of the single-crystal AlN substrate may be approximately 150 mm or smaller, approximately 100 mm or smaller, approximately 75 mm or smaller, or approximately 50 mm or smaller. The diameter of the single-crystal AlN substrate may be approximately 50 mm. A light-emitting device may be fabricated over at least a portion of the AlN substrate. The light-emitting device may be configured to emit ultraviolet light. After forming at least a portion of the light-emitting device (e.g., all or a portion of an epitaxial light-emitting layer structure), at least a portion (or even all) of the AlN substrate may be removed from the light-emitting device. The light-emitting device may include, consist essentially of, or consist of a light-emitting diode and/or a laser.

At least a portion of the AlN boule may be treated after the AlN boule is cooled to approximately room temperature. At least a portion of the AlN boule may be disposed within a heating chamber different from the first and second crucibles. Gas (e.g., nitrogen gas) may be provided within the heating chamber at a pressure ranging from approximately 0.5 bar to approximately 2 bars. A temperature within the heating chamber may be ramped to an annealing temperature at a ramp rate ranging from approximately 1° C./min to approximately 50° C./min. The annealing temperature may range from approximately 2100° C. to approximately 2500° C. The at least a portion of the AlN boule may be annealed at the annealing temperature for a time period ranging from approximately 0.5 hour to approximately 100 hours. Thereafter, the at least a portion of the AlN boule may be cooled via a cooling cycle. The cooling cycle may include, consist essentially of, or consist of (i) cooling the at least a portion of the AlN boule from the annealing temperature to a fifth temperature ranging from 800° C. to 1250° C. over a time period ranging from 10 hours to 100 hours, and (ii) thereafter, cooling the at least a portion of the AlN boule to approximately room temperature. Gas (e.g., nitrogen gas) may be provided within the heating chamber at a pressure ranging from approximately 1 bar to approximately 2 bars. The at least a portion of the AlN boule may be annealed for a time period ranging from approximately 0.5 hour to approximately 5 hours. During the cooling cycle, the at least a portion of the AlN boule may be cooled from the annealing temperature to the fifth temperature over a time period ranging from 10 hours to 20 hours. Before disposing the at least a portion of the AlN boule within the heating chamber, one or more AlN substrates may be separated from the AlN boule, and the at least a portion of the AlN boule may include, consist essentially of, or consist of at least one (or at least a portion of at least one) of the AlN substrates. The at least a portion of the AlN boule may include, consist essentially of, or consist of the AlN boule (with or without the seed crystal). Before the at least a portion of the AlN boule is disposed within the heating chamber, an oxygen concentration of the at least a portion of the AlN boule may range from approximately $1 \times 10^{18}$ cm$^{-3}$ to approximately $1 \times 10^{19}$ cm$^{-3}$, and/or a carbon concentration of the at least a portion of the AlN boule may range from approximately $1 \times 10^{18}$ cm$^{-3}$ to approximately $1 \times 10^{19}$ cm$^{-3}$. Before the at least a portion of the AlN boule is disposed within the heating chamber, an oxygen concentration of the at least a portion of the AlN boule may range from approximately $1 \times 10^{17}$ cm$^{-3}$ to approximately $1 \times 10^{19}$ cm$^{-3}$, and/or a carbon concentration of the at least a portion of the AlN boule may range from approximately $1 \times 10^{17}$ cm$^{-3}$ to approximately $1 \times 10^{19}$ cm$^{-3}$. The interior of the heating chamber may include, consist essentially of, or consist of one or more refractory metals. The interior of the heating chamber may include, consist essentially of, or consist of W. Prior to disposing the at least a portion of the AlN boule within the heating chamber, the interior of the heating chamber may be heated to a temperature no less than 2600° C. under a pressure of less than 1 bar. The interior of the heating chamber may be heated for a time ranging from approximately 0.5 hour to approximately 2 hours. The heating chamber may include, consist essentially of, or consist of a resistive furnace or a radio-frequency furnace. The at least a portion of the AlN boule may be annealed at the annealing temperature at least quasi-isothermally.

Embodiments of the invention may include AlN boules, substrates, and/or light-emitting devices formed or formable in accordance with any of the above methods.

In yet another aspect, embodiments of the invention feature a method of forming single-crystal aluminum nitride (AlN). A bulk polycrystalline AlN ceramic is provided. At least a portion of the AlN ceramic is disposed into a crystal-growth crucible. A seed crystal is disposed into the crystal-growth crucible. The seed crystal may include, consist essentially of, or consist of single-crystal AlN. The crystal-growth crucible is disposed into a furnace. The crystal-growth crucible is heated with the furnace to a growth temperature of at least 2000° C. The crystal-growth crucible is maintained at the growth temperature for a soak time. The soak time may range from 1 hour to 10 hours. After the soak time, while the crystal-growth crucible is at the growth temperature, (i) vapor including, consisting essentially of, or consisting of aluminum and nitrogen is condensed on the seed crystal, thereby forming a single-crystalline AlN boule extending from the seed crystal, and (ii) the crystal-growth crucible is moved relative to the furnace. A growth rate of the AlN boule may be approximately equal to a rate of relative motion between the crystal-growth crucible and the furnace. Thereafter, the AlN boule is cooled to approximately room temperature. After the AlN boule is cooled to approximately room temperature, at least a portion of the AlN boule is disposed within a heating chamber different from the crystal-growth crucible. Gas (e.g., nitrogen gas) is provided within the heating chamber at a pressure ranging from approximately 0.5 bar to approximately 2 bars. A temperature within the heating chamber is ramped to an annealing temperature at a ramp rate ranging from approximately 1° C./min to approximately 50° C./min. The annealing temperature ranges from approximately 2100° C. to approximately 2500° C. The at least a portion of the AlN boule is annealed at the annealing temperature for a time period ranging from approximately 0.5 hour to approximately 100 hours. Thereafter, the at least a portion of the AlN boule is cooled via a cooling cycle. The cooling cycle includes, consists essentially of, or consists of (i) cooling the at least a portion of the AlN boule from the annealing temperature to an intermediate temperature ranging from 800° C. to 1250° C. over a time period ranging from 10 hours to 100 hours, and (ii) thereafter, cooling the at least a portion of the AlN boule to approximately room temperature.

Embodiments of the invention may include one or more of the following in any of a variety of combinations. The growth temperature may be approximately 2300° C. or less, approximately 2200° C. or less, or approximately 2100° C. or less. The diameter of at least a portion (or even all) of the AlN boule may be at least approximately 25 mm, at least approximately 35 mm, at least approximately 50 mm, at least approximately 75 mm, or at least approximately 100 mm. The diameter of at least a portion (or even all) of the AlN boule may be at most approximately 150 mm, at most approximately 125 mm, at most approximately 100 mm, or at most approximately 75 mm. The diameter of at least a portion (or even all) of the AlN boule may be approximately 50 mm.

Prior to disposing the at least a portion of the AlN ceramic into the first crucible, the AlN ceramic may be fragmented into fragments. One or more fragments may be selected as the at least a portion of the AlN ceramic. One or more (or even each) of the fragments may have a width (or diameter, or length, or other dimension) greater than approximately 0.1 cm, greater than approximately 0.2 cm, greater than approximately 0.3 cm, greater than approximately 0.4 cm, greater than approximately 0.5 cm, greater than approximately 0.7 cm, or greater than approximately 1 cm. One or more (or even each) of the fragments may have a width (or diameter, or length, or other dimension) less than approximately 5 cm, less than approximately 4 cm, less than approximately 3 cm, less than approximately 2 cm, less than approximately 1.5 cm, or less than approximately 1 cm. A crystalline orientation of the seed crystal may be substantially parallel to a c-axis.

The growth rate may be at least 0.1 mm/hour, at least 0.2 mm/hour, at least 0.3 mm/hour, at least 0.4 mm/hour, at least 0.5 mm/hour, at least 0.7 mm/hour, or at least 1 mm/hour. The growth rate may be at most 3 mm/hour, at most 2.5 mm/hour, at most 2 mm/hour, at most 1.5 mm/hour, or at most 1 mm/hour. The soak time may be at least approximately 2 hours, at least approximately 3 hours, at least approximately 4 hours, at least approximately 5 hours, at least approximately 8 hours, or at least approximately 10 hours. The soak time may be at most approximately 20 hours, at most approximately 18 hours, at most approximately 17 hours, at most approximately 16 hours, or at most approximately 15 hours. The soak time may be approximately 5 hours. The soak time may be approximately 5 hours. The soak time may be approximately 5-10 hours. The soak time may be approximately 1-5 hours. The diameter of the seed crystal may be approximately 25 mm or larger, approximately 30 mm or larger, approximately 35 mm or larger, approximately 40 mm or larger, approximately 45 mm or larger, or approximately 50 mm or larger. The diameter of the seed crystal may be approximately 150 mm or smaller, approximately 100 mm or smaller, approximately 75 mm or smaller, or approximately 50 mm or smaller.

The AlN boule may be sliced to form a single-crystal AlN substrate having a diameter of at least 25 mm, at least 30 mm, at least 35 mm, at least 40 mm, at least 45 mm, or at least 50 mm. The diameter of the single-crystal AlN substrate may be approximately 150 mm or smaller, approximately 100 mm or smaller, approximately 75 mm or smaller, or approximately 50 mm or smaller. The diameter of the single-crystal AlN substrate may be approximately 50 mm. A light-emitting device may be fabricated over at least a portion of the AlN substrate. The light-emitting device may be configured to emit ultraviolet light. After forming at least a portion of the light-emitting device (e.g., all or a portion of an epitaxial light-emitting layer structure), at least a portion (or even all) of the AlN substrate may be removed from the light-emitting device. The light-emitting device may include, consist essentially of, or consist of a light-emitting diode and/or a laser.

Gas (e.g., nitrogen gas) may be provided within the heating chamber at a pressure ranging from approximately 1 bar to approximately 2 bars. The at least a portion of the AlN boule may be annealed for a time period ranging from approximately 0.5 hour to approximately 5 hours. During the cooling cycle, the at least a portion of the AlN boule may be cooled from the annealing temperature to the intermediate temperature over a time period ranging from 10 hours to 20 hours. Before disposing the at least a portion of the AlN boule within the heating chamber, one or more AlN substrates may be separated from the AlN boule, and the at least a portion of the AlN boule may include, consist essentially of, or consist of at least one (or at least a portion of at least one) of the AlN substrates. The at least a portion of the AlN boule may include, consist essentially of, or consist of the AlN boule (with or without the seed crystal).

The interior of the heating chamber may include, consist essentially of, or consist of one or more refractory metals. The interior of the heating chamber may include, consist essentially of, or consist of W. Prior to disposing the at least a portion of the AlN boule within the heating chamber, the interior of the heating chamber may be heated to a temperature no less than 2600° C. under a pressure of less than 1 bar. The interior of the heating chamber may be heated for a time ranging from approximately 0.5 hour to approximately 2 hours. The heating chamber may include, consist essentially of, or consist of a resistive furnace or a radio-frequency furnace. The at least a portion of the AlN boule may be annealed at the annealing temperature at least quasi-isothermally (i.e., isothermally or quasi-isothermally).

Embodiments of the invention may include AlN boules, substrates, and/or light-emitting devices formed or formable in accordance with any of the above methods.

In another aspect, embodiments of the invention feature a method of forming single-crystal aluminum nitride (AlN). A bulk polycrystalline AlN ceramic is provided. The bulk polycrystalline AlN ceramic is fragmented into fragments. One or more fragments each having a width greater than approximately 0.5 cm and less than approximately 2 cm are selected as an AlN source material. The AlN source material is disposed into a crystal-growth crucible. A seed crystal is disposed into the crystal-growth crucible. The seed crystal may include, consist essentially of, or consist of single-crystal AlN. The crystal-growth crucible is disposed into a furnace. The crystal-growth crucible is heated with the furnace to a growth temperature of at least 2000° C. The crystal-growth crucible is maintained at the growth temperature for a soak time. The soak time may range from 1 hour to 10 hours. After the soak time, while the crystal-growth crucible is at the growth temperature, (i) vapor including, consisting essentially of, or consisting of aluminum and nitrogen is condensed on the seed crystal, thereby forming a single-crystalline AlN boule extending from the seed crystal, and (ii) the crystal-growth crucible is moved relative to the furnace. A growth rate of the AlN boule may be approximately equal to a rate of relative motion between the crystal-growth crucible and the furnace. Thereafter, the AlN boule is cooled to approximately room temperature.

Embodiments of the invention may include one or more of the following in any of a variety of combinations. Providing the bulk polycrystalline AlN ceramic may include, consist essentially of, or consist of (a) providing a pellet including, consisting essentially of, or consisting of Al within a reaction crucible, (b) reacting the pellet at a reaction temperature and a reaction pressure with nitrogen, and repeating steps (a) and (b) to form the bulk polycrystalline AlN ceramic. No sublimation-recondensation treatment may be performed on the bulk polycrystalline AlN ceramic or the AlN source material before the AlN source material is disposed into the crystal-growth crucible. When the bulk polycrystalline AlN ceramic reaches approximately room temperature after step (c), the bulk polycrystalline AlN ceramic may have (i) less than approximately 1% excess Al and/or (ii) an oxygen concentration of less than approximately 100 ppm. The reaction temperature may range from approximately 1600° C. to approximately 2200° C. The reaction temperature may range from approximately 1900°

C. to approximately 2200° C. The reaction pressure may be within the range of approximately 1 bar to approximately 60 bars. The pellet may be reacted in an atmosphere (i) including, consisting essentially of, or consisting of nitrogen gas and/or (ii) substantially free of hydrogen. The bulk polycrystalline AlN ceramic may have a carbon concentration ranging from approximately 100 ppm to approximately 300 ppm. The AlN source material may have a carbon concentration ranging from approximately 5 ppm to approximately 60 ppm. The AlN source material may have a carbon concentration ranging from approximately 5 ppm to approximately 26 ppm.

The growth temperature may be approximately 2300° C. or less, approximately 2200° C. or less, or approximately 2100° C. or less. The diameter of at least a portion (or even all) of the AlN boule may be at least approximately 25 mm, at least approximately 35 mm, at least approximately 50 mm, at least approximately 75 mm, or at least approximately 100 mm. The diameter of at least a portion (or even all) of the AlN boule may be at most approximately 150 mm, at most approximately 125 mm, at most approximately 100 mm, or at most approximately 75 mm. The diameter of at least a portion (or even all) of the AlN boule may be approximately 50 mm.

A crystalline orientation of the seed crystal may be substantially parallel to a c-axis. The growth rate may be at least 0.1 mm/hour, at least 0.2 mm/hour, at least 0.3 mm/hour, at least 0.4 mm/hour, at least 0.5 mm/hour, at least 0.7 mm/hour, or at least 1 mm/hour. The growth rate may be at most 3 mm/hour, at most 2.5 mm/hour, at most 2 mm/hour, at most 1.5 mm/hour, or at most 1 mm/hour. The soak time may be at least approximately 2 hours, at least approximately 3 hours, at least approximately 4 hours, at least approximately 5 hours, at least approximately 8 hours, or at least approximately 10 hours. The soak time may be at most approximately 20 hours, at most approximately 18 hours, at most approximately 17 hours, at most approximately 16 hours, or at most approximately 15 hours. The soak time may be approximately 5 hours. The soak time may be approximately 5 hours. The soak time may be approximately 5-10 hours. The soak time may be approximately 1-5 hours. The diameter of the seed crystal may be approximately 25 mm or larger, approximately 30 mm or larger, approximately 35 mm or larger, approximately 40 mm or larger, approximately 45 mm or larger, or approximately 50 mm or larger. The diameter of the seed crystal may be approximately 150 mm or smaller, approximately 100 mm or smaller, approximately 75 mm or smaller, or approximately 50 mm or smaller.

The AlN boule may be sliced to form a single-crystal AlN substrate having a diameter of at least 25 mm, at least 30 mm, at least 35 mm, at least 40 mm, at least 45 mm, or at least 50 mm. The diameter of the single-crystal AlN substrate may be approximately 150 mm or smaller, approximately 100 mm or smaller, approximately 75 mm or smaller, or approximately 50 mm or smaller. The diameter of the single-crystal AlN substrate may be approximately 50 mm. A light-emitting device may be fabricated over at least a portion of the AlN substrate. The light-emitting device may be configured to emit ultraviolet light. After forming at least a portion of the light-emitting device (e.g., all or a portion of an epitaxial light-emitting layer structure), at least a portion (or even all) of the AlN substrate may be removed from the light-emitting device. The light-emitting device may include, consist essentially of, or consist of a light-emitting diode and/or a laser.

At least a portion of the AlN boule may be treated after the AlN boule is cooled to approximately room temperature. At least a portion of the AlN boule may be disposed within a heating chamber different from the crystal-growth crucible. Gas (e.g., nitrogen gas) may be provided within the heating chamber at a pressure ranging from approximately 0.5 bar to approximately 2 bars. A temperature within the heating chamber may be ramped to an annealing temperature at a ramp rate ranging from approximately 1° C./min to approximately 50° C./min. The annealing temperature may range from approximately 2100° C. to approximately 2500° C. The at least a portion of the AlN boule may be annealed at the annealing temperature for a time period ranging from approximately 0.5 hour to approximately 100 hours. Thereafter, the at least a portion of the AlN boule may be cooled via a cooling cycle. The cooling cycle may include, consist essentially of, or consist of (i) cooling the at least a portion of the AlN boule from the annealing temperature to an intermediate temperature ranging from 800° C. to 1250° C. over a time period ranging from 10 hours to 100 hours, and (ii) thereafter, cooling the at least a portion of the AlN boule to approximately room temperature. Gas (e.g., nitrogen gas) may be provided within the heating chamber at a pressure ranging from approximately 1 bar to approximately 2 bars. The at least a portion of the AlN boule may be annealed for a time period ranging from approximately 0.5 hour to approximately 5 hours. During the cooling cycle, the at least a portion of the AlN boule may be cooled from the annealing temperature to the intermediate temperature over a time period ranging from 10 hours to 20 hours. Before disposing the at least a portion of the AlN boule within the heating chamber, one or more AlN substrates may be separated from the AlN boule, and the at least a portion of the AlN boule may include, consist essentially of, or consist of at least one (or at least a portion of at least one) of the AlN substrates. The at least a portion of the AlN boule may include, consist essentially of, or consist of the AlN boule (with or without the seed crystal). The interior of the heating chamber may include, consist essentially of, or consist of one or more refractory metals. The interior of the heating chamber may include, consist essentially of, or consist of W. Prior to disposing the at least a portion of the AlN boule within the heating chamber, the interior of the heating chamber may be heated to a temperature no less than 2600° C. under a pressure of less than 1 bar. The interior of the heating chamber may be heated for a time ranging from approximately 0.5 hour to approximately 2 hours. The heating chamber may include, consist essentially of, or consist of a resistive furnace or a radio-frequency furnace. The at least a portion of the AlN boule may be annealed at the annealing temperature at least quasi-isothermally.

Embodiments of the invention may include AlN boules, substrates, and/or light-emitting devices formed or formable in accordance with any of the above methods.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
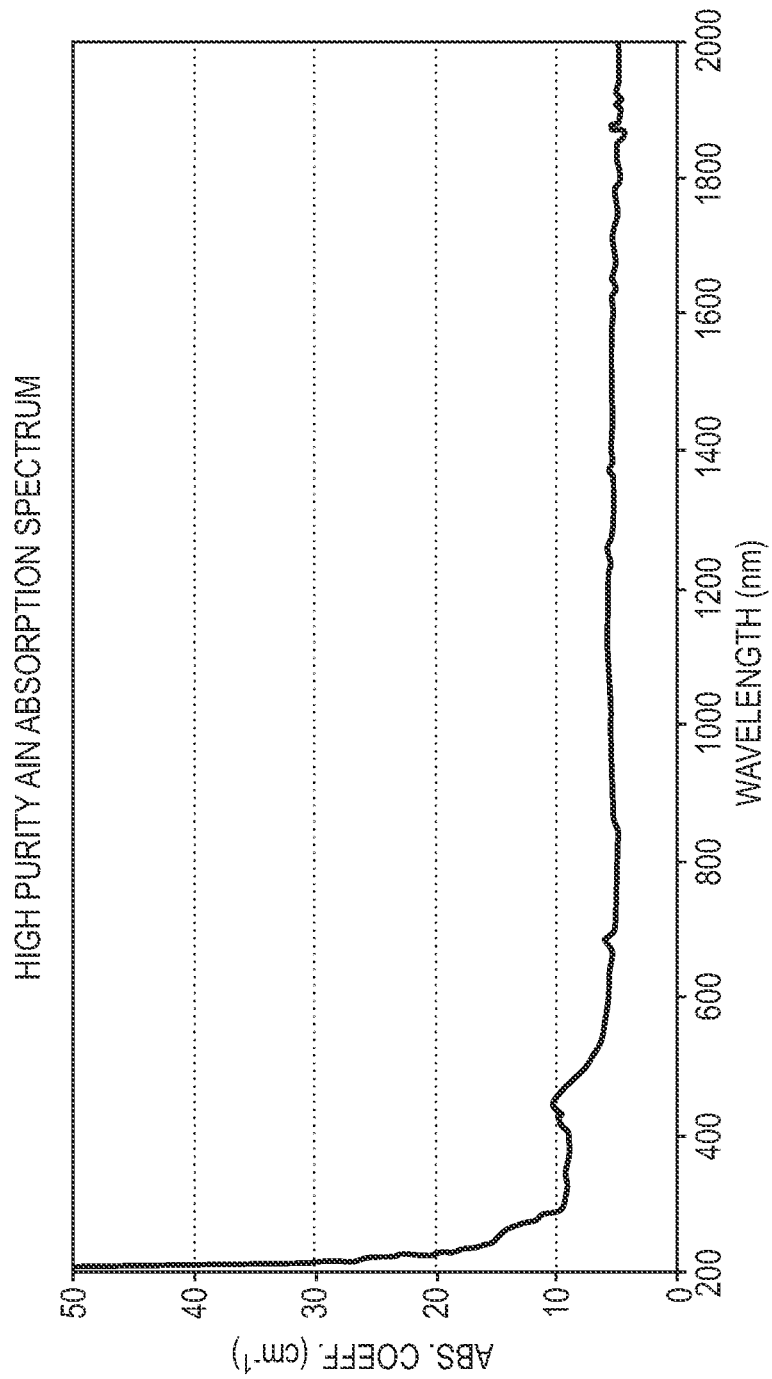
FIG. 1A is a graph of UV absorption coefficient, as a function of wavelength, for single-crystal AlN produced utilizing conventional growth techniques.
Figure 1B:
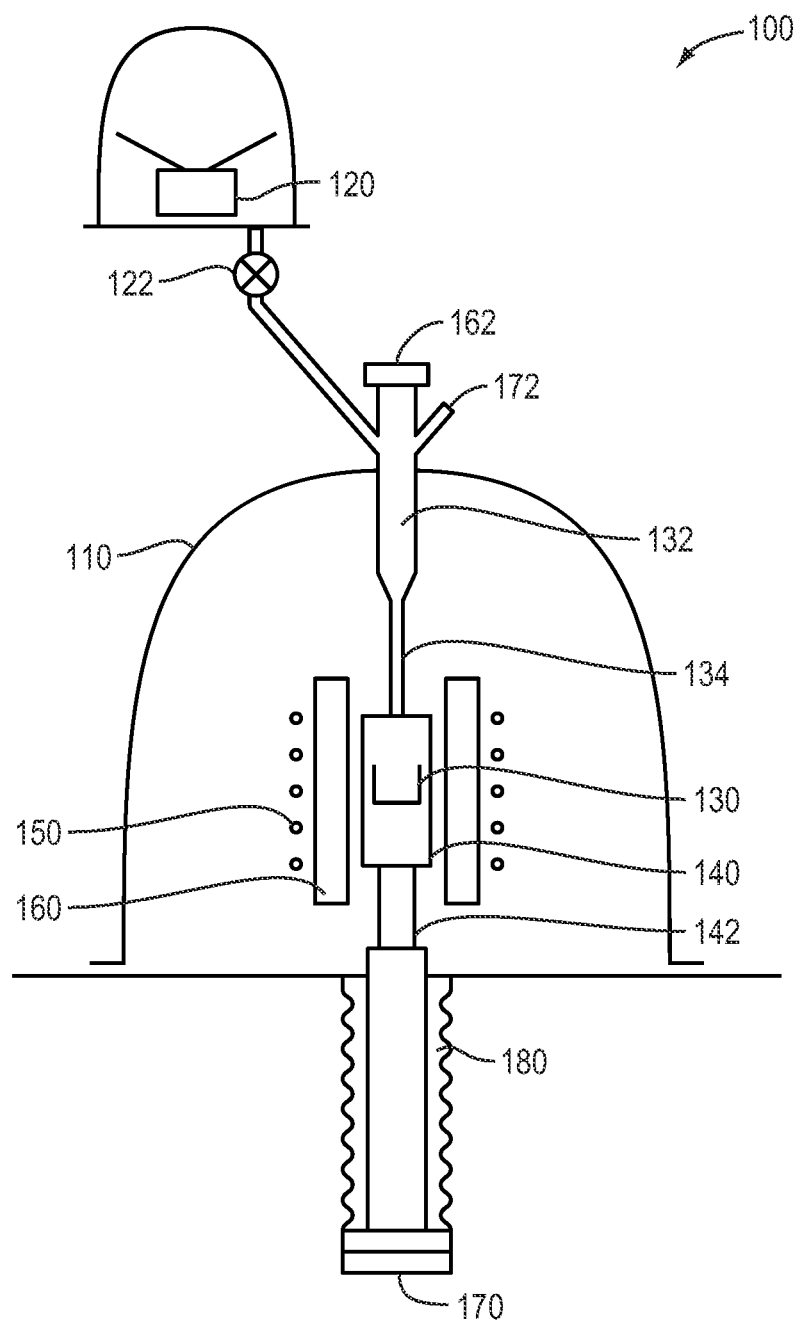
FIGS. 1B-1D are schematic diagrams of a reactor utilized for the formation of polycrystalline ceramic source material in accordance with various embodiments of the invention.
Figure 1C:
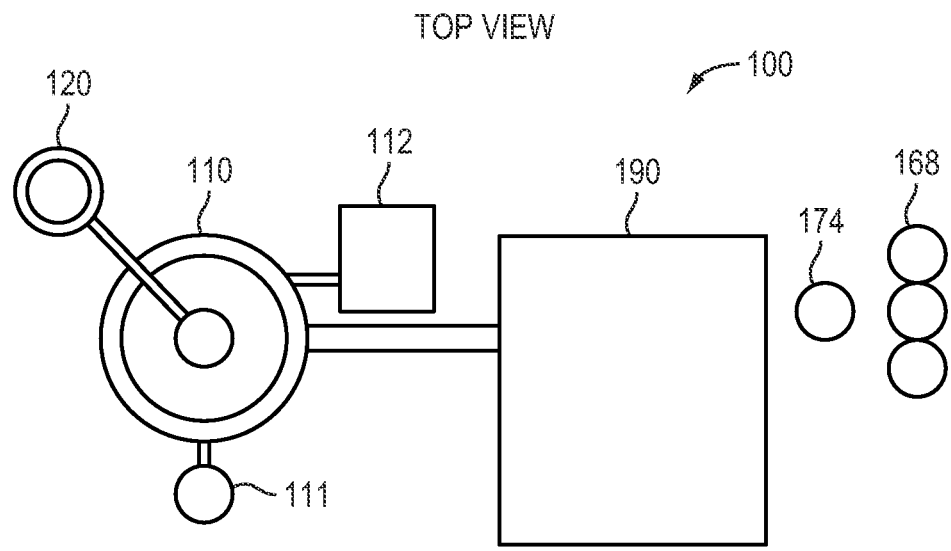
Figure 1D:
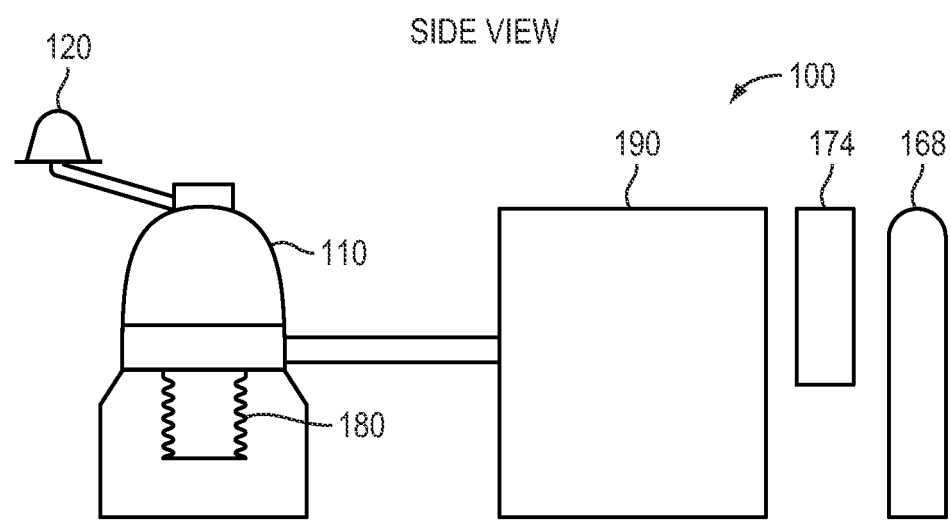
Figure 1E:
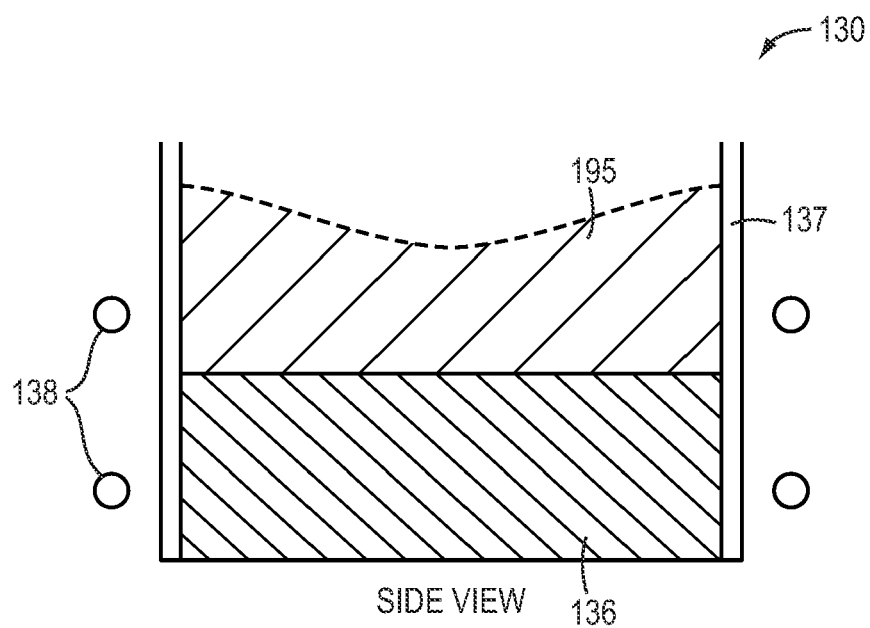
FIGS. 1E and 1F are schematic diagrams of a crucible utilized for the formation of polycrystalline ceramic source material in accordance with various embodiments of the invention.
Figure 1F:
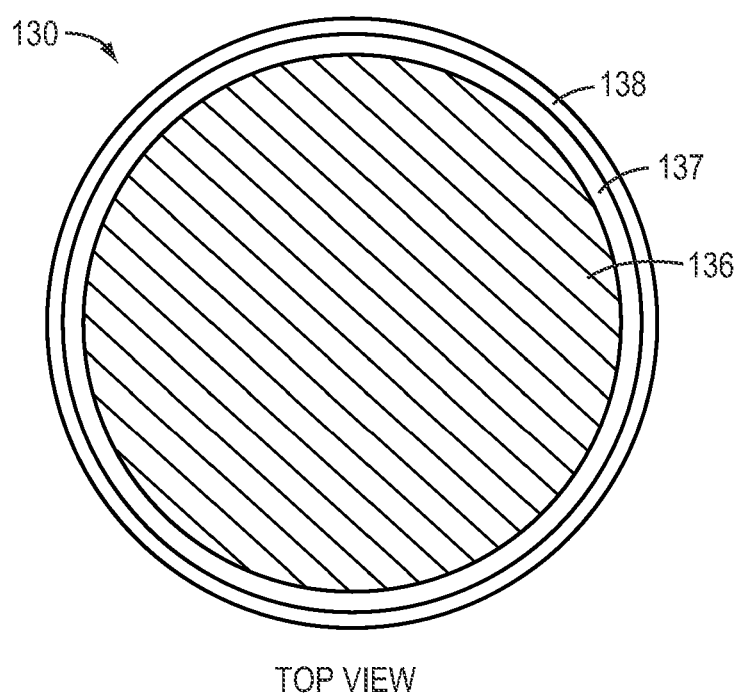

Embodiments of the present invention enable the fabrication of high-quality single-crystal AlN bulk crystals (i.e., boules and/or substrates) that are highly UV transparent, even at deep-UV wavelengths. In various embodiments, production of such AlN bulk crystals begins with the fabrication of highly stoichiometric polycrystalline AlN source material that may be utilized in a vapor-transport growth process (e.g., sublimation-recondensation) to form the AlN bulk crystals. The AlN source material also desirably has a fairly low oxygen content, e.g., concentrations of approximately 100 ppm to approximately 400 ppm. For example, polycrystalline AlN source material may be fabricated in accordance with the techniques described in the '519 patent, which reports polycrystalline AlN ceramic material having an oxygen content of about 100 ppm or less and which possesses a high degree of stoichiometry, i.e., excess Al of less than approximately 0.1%. AlN source material may also be formed in accordance with techniques described in C. Hartmann, et al., "Preparation of deep UV transparent AlN substrates with high structural perfection for optoelectronic devices," CrystEngComm, 2016, 19, 3488-3497 ("the Hartmann reference"), in which is described a polycrystalline AlN source produced by multiple sublimation-recrystallization steps and that exhibits 100 ppm-140 ppm residual oxygen.

While the resulting polycrystalline AlN ceramic may contain advantageously low concentrations of oxygen, various embodiments of the present invention feature additional preparation that reduces or minimizes concentrations of other contaminants such as carbon. Carbon is typically difficult to remove from AlN. For example, even E-Grade AlN powder commercially available from Tokuyama Corporation of Tokyo, Japan is reported to typically have carbon concentrations of 200 ppm. In various embodiments, the polycrystalline AlN ceramic may be fabricated in accordance with the techniques described in the '519 patent, i.e., a "pellet-drop" technique using high-purity Al pellets. For example, referring to FIGS. 1B-1F, a reactor 100 may be utilized in the formation of a polycrystalline AlN ceramic 195 that includes, consists essentially of, or consists of high-purity AlN. Reactor 100 may include a reaction vessel 110, which may be fabricated of double-walled stainless steel and may be water cooled. Reaction vessel 110 may be capable of a maximum internal gas pressure of approximately 45 pounds per square inch (psi), and may be evacuated, e.g., by a turbo pump 111 (backed by a mechanical pump 112) to approximately $10^{-7}$ Torr. A feeder mechanism 120 is connected to the top of reaction vessel 110, and may be evacuated and pressurized with the same gases and pressures as reaction vessel 110. Feeder mechanism 120 may be isolated from reaction vessel 110 by an isolation valve 122. Pellets (which may include, consist essentially of, or consist of high (e.g., five nines) purity undoped Al and may be shaped approximately cylindrically) released from feeder mechanism 120 are directed to a crucible 130 by an upper funnel 132 and a lower funnel 134.

In various embodiments, crucible 130 includes, consists essentially of, or consists of a bottom plug 136 and a foil wrap 137. Bottom plug 136 may be approximately cylindrical with, e.g., a diameter of approximately 2 inches and a height of approximately 0.5 inches. Bottom plug 136 may include, consist essentially of, or consist of tungsten (W) or another high-melting-point material inert to AlN. Foil wrap 137 wraps around bottom plug 136, forming a cylinder open at the top and sealed at the bottom by bottom plug 136. Foil wrap 137 may include, consist essentially of, or consist of W, or another high melting point material inert to AlN, and may have a thickness of approximately 0.001 inch. In an embodiment, foil wrap 137 may be wrapped around bottom plug 136 multiple times, e.g., a three-ply foil wrap 137 is formed by wrapping W foil around bottom plug 137 three times. Foil wrap 137 may be held in place by wire 138. Wire 138 may include, consist essentially of, or consist of a tungsten-rhenium alloy (e.g., 25% rhenium) and have a thickness of approximately 0.01 inch.

As shown, crucible 130 is disposed within a reaction zone 140 and on top of a crucible stand 142. Both reaction zone 140 and crucible stand 142 may include, consist essentially of, or consist of W. Lower funnel 134 is disposed above the top opening of crucible 130, and may include, consist essentially of, or consist of W. Lower funnel 134 is shaped to direct pellets from feeder mechanism 120 and upper funnel 132 into crucible 130.

Reactor 100 includes an inductive heating coil 150, which wraps around insulation 160. Insulation 160 may include, consist essentially of, or consist of bubble alumina available from Zircar Ceramics, Inc. of Florida, New York held within a quartz holder. Inductive heating coil 150 may be a 10 kHz, 20 kilowatt inductive heating system available from Mesta Electronics, Inc. of N. Huntingdon, Pennsylvania, and may heat to temperatures up to approximately 2300° C. An optical pyrometer port 162 enables the measurement of temperature inside the reaction zone defined by inductive heating coil 150 by pyrometry. Gas from a series of gas tanks representatively indicated at 168 flows into reactor 100 from a bottom inlet 170 and/or a top inlet 172. The gas may include, consist essentially of, or consist of nitrogen or forming gas, and is filtered by a gas filter 174 that reduces levels of contaminants such as oxygen, water vapor, and hydrocarbons to less than 10 ppb. A vertical drive 180 is used to move crucible 130 in and out of the hot zone created by inductive heating coil 150. A conventional control station 190 includes electronic controls and power supplies for all of the components associated with reactor 100.

In order to form the polycrystalline ceramic 195, pellets are cleaned in preparation for loading into feeder mechanism 120. First, the pellets are sifted (with or without water) in order to remove oddly shaped pellets or small shavings. In various embodiments, a refined cleaning procedure may be utilized to reduce the amount of carbon on the pellets. Semiconductor-grade Al pellets are commercially available, and when received such pellets typically have carbon concentrations ranging from 25 ppm to about 40 ppm by weight, as measured by Instrumental Gas Analysis (IGA) (e.g., at a vendor such as EAG Laboratories of Liverpool, New York). The pellets may be ultrasonically cleaned in isopropyl alcohol (IPA) (e.g., for a time period of approximately 20 minutes), etched in hydrochloric acid (HCl) (e.g., for a time period of approximately 7 minutes), and rinsed several times (e.g. three times) in distilled water. After another ultrasonic clean in IPA (e.g., for a time period of approximately 20 minutes), the pellets are immersed in a mixture (e.g., a 50%-50% solution by volume) of HF and $HNO_3$ (e.g., for a time period of approximately 2 minutes) at room temperature. Finally, the pellets are rinsed in distilled water and multiple times in IPA, whereupon they may be stored in an inert or nitrogen atmosphere prior to loading in feeder mechanism 120. After cleaning, the pellets may have an average carbon content of approximately 5 ppm by weight, as measured by IGA.

Crucible 130 is loaded into reactor 100, and pellets are loaded into feeder mechanism 120. Reaction chamber 110 and feeder mechanism 120 are evacuated, e.g., to a pressure less than approximately $5 \times 10^{-5}$ Torr, and refilled with forming gas to a pressure of approximately 6 psi. Either nitrogen ($N_2$) gas or forming gas flows into reaction chamber 110 from bottom inlet 170 and/or top inlet 172 at a rate of approximately 0.25 lpm. The flow of gas provides a sufficient amount of nitrogen in reaction chamber 110 to convert the pellet(s) to AlN (as described below). Inductive heating coil 150 may heat crucible 130 to approximately 1900-2200° C., although even higher temperatures may be utilized. In an embodiment, inductive heating coil 150 heats crucible 130 to approximately 2000-2050° C. Temperatures in this range have been found to be sufficient to totally react the pellets into stoichiometric AlN (which includes less than approximately 1% unreacted Al) and to drive off higher vapor pressure impurities that may be trapped within polycrystalline ceramic 130 and create optical absorptions. The temperature at crucible 130 may be measured by pyrometry through optical pyrometer port 162. Once crucible 130 reaches the desired temperature, the temperature and gas flow conditions within reactor 100 are held constant for a pre-soak cycle (e.g., approximately 3 hours). The pre-soak cleans crucible 130 and other parts of reactor 100 of contaminants, e.g., oxides, before the introduction of the Al pellets.

A reaction cycle is then performed to form polycrystalline ceramic 195. Pellets are dropped from feeder mechanism 120, through upper funnel 132 and lower funnel 134, into crucible 130. The pellets may each weigh approximately 0.23 gram, and may be dropped at a rate of approximately 1 every 90 seconds. Feeder mechanism 120 may incorporate an optical counter that counts actual pellet drops and may cycle feeder mechanism 120 to drop an additional pellet in case of a loading error. The pellets land on bottom plug 136 (or the portion of polycrystalline ceramic 195 already produced thereon), melt, and react with the nitrogen gas to form polycrystalline ceramic 195. Each subsequent pellet dropped from feeder mechanism 120 reacts and increases the size and volume of polycrystalline ceramic 195. In an embodiment, substantially all of each pellet reacts to form polycrystalline ceramic 195. After a desired number of pellets are reacted to form polycrystalline ceramic 195, the reaction gas flow rate and temperature are maintained for a time period (e.g., approximately 1 hour) to ensure that the reaction is complete.

After the reaction cycle, crucible 130 (and polycrystalline ceramic 195) may be cooled down to approximately room temperature at a positive nitrogen pressure (e.g., over a time period of approximately 1 hour). Thus formed, polycrystalline ceramic 195 includes, consists essentially of, or consists of high-purity AlN. In an embodiment, an oxygen concentration (and/or concentration of other impurities such as boron or transition metals) of polycrystalline ceramic 195 is less than approximately 400 ppm by weight, and may even be less than approximately 100 ppm. In various embodiments, the oxygen concentration of polycrystalline ceramic 195, as measured by instrumental gas analysis (IGA), ranges from approximately $5.3 \times 10^{19}$ $cm^{-3}$ to approximately $6.1 \times 10^{19}$ $cm^{-3}$. In various embodiments, the carbon concentration of polycrystalline ceramic 195, as measured by IGA, ranges from approximately 230 ppm to approximately 280 ppm.

Polycrystalline ceramic 195 includes, consists essentially of, or consists of AlN that is approximately stoichiometric, i.e., AlN that contains less than approximately 1% excess Al, less than approximately 0.5% excess Al, or even less than approximately 0.1% excess Al. After formation, polycrystalline ceramic 195 may be stored in an inert atmosphere in preparation for utilization thereof to fabricate high-quality polycrystalline AlN source material.

As mentioned above, various embodiments of the present invention feature additional preparation of the polycrystalline AlN ceramic that reduces or minimizes concentrations of contaminants such as carbon. In various embodiments, the ceramic is broken up into fragments to facilitate removal of much of the carbon therefrom. The ceramic may be fragmented by, e.g., application of mechanical force. The present inventors have found that, surprisingly, much of the carbon present in the polycrystalline AlN ceramic remains on smaller fragments and/or dust (e.g., particles having large aggregate surface area and/or having diameters less than about 2 mm) resulting from the fragmentation process, while larger fragments (e.g., ones having widths, diameters, or other lateral dimensions ranging from 0.5 cm to 2 cm) exhibit smaller carbon concentrations. In various embodiments, the fragments of the AlN ceramic may be separated on the basis of size using one or more sieves, and/or compressed air or another fluid (e.g., nitrogen or an inert gas such as argon) may be applied to the fragments to minimize or reduce the amount of dust or other particles thereon.

Figure 1G:
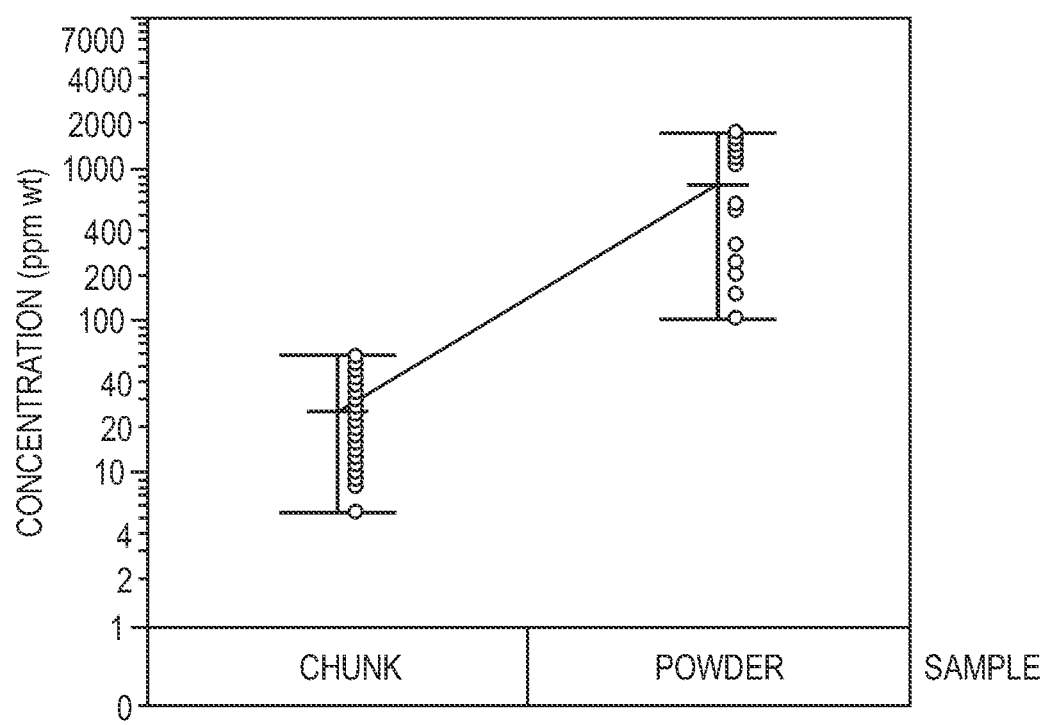
FIG. 1G is a graph of carbon concentration of different portions of polycrystalline AlN ceramic prepared and fragmented in accordance with various embodiments of the invention.

As shown in FIG. 1G, in various embodiments, after fragmentation and separation, the larger fragments (or "chunks" as depicted on FIG. 1G) have carbon concentrations that range from approximately 5 ppm to approximately 60 ppm, with an average carbon concentration of approximately 26 ppm. In stark contrast, the resulting powder and smaller fragments have carbon concentrations that range from approximately 108 ppm to approximately 1800 ppm, with an average carbon concentration of approximately 823 ppm. FIG. 1G depicts data from 16 distinct sets of fragments and powder resulting from fragmentation of different polycrystalline AlN ceramics.

Figure 1H:
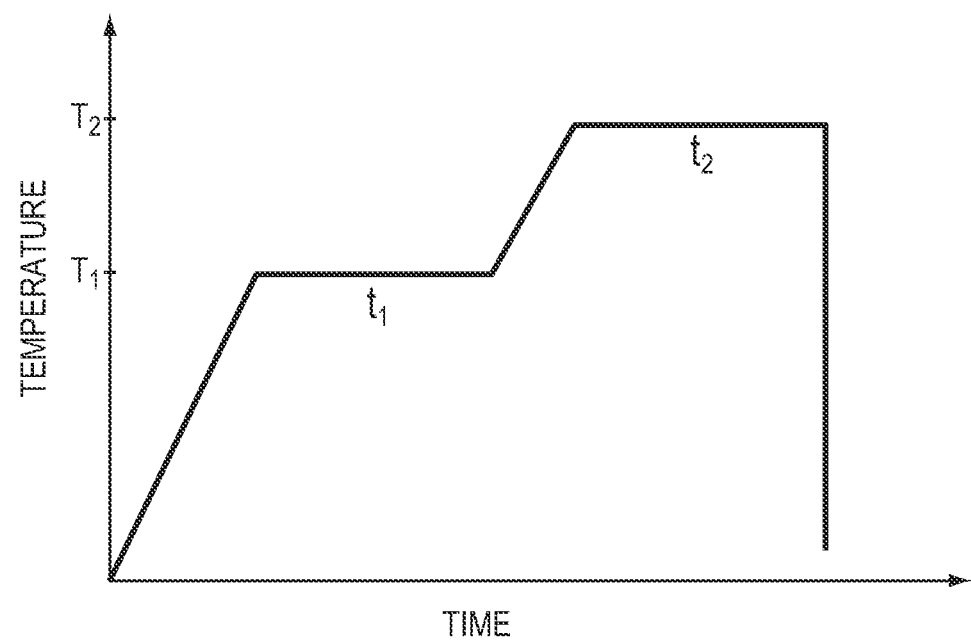
FIGS. 1H and 1I are graphs of example heat treatments for the optional densification of polycrystalline source material in accordance with various embodiments of the invention.

In accordance with various embodiments of the invention, one or more of the larger fragments of the AlN polycrystalline ceramic, once separated from the smaller fragments and powder, may be utilized directly as the source material for formation of single-crystal AlN (as detailed below). In other embodiments, one or more (typically more) of the fragments are collected and placed into a crucible (e.g., a tungsten (W) vessel) for subsequent heat treatment. (While in preferred embodiments only the larger fragments of the polycrystalline AlN ceramic are heat treated, embodiments of the invention do encompass heat treatment of the entire, unfragmented ceramic.) In various embodiments, the optional subsequent preparation stage involves an annealing and densification treatment of at least a portion of polycrystalline ceramic 195 (e.g., one or more larger fragments of the ceramic 195) to form high-quality polycrystalline AlN source material. As shown in FIG. 1H, in accordance with various embodiments of the invention, the AlN ceramic (or portion thereof) may be heated to a first temperature T1 ranging from 1100° C. to 2000° C. and held at temperature T1 for a time period t1 of, for example, 2 hours to 25 hours. Thereafter, the ceramic (or portion thereof) may be heated to a higher second temperature T2 (e.g., a temperature ranging from 2000° C. to 2250° C.) and held at temperature T2 for a time period t2 of, for example, 3 hours to 15 hours. During the heat treatment, the ceramic (or portion thereof) is annealed and densified to form a polycrystalline AlN source material that may be utilized in the subsequent formation of single-crystal AlN bulk crystals. Because the polycrystalline AlN source material is generally approximately stoichiometric AlN with low concentrations of impurities, it may be used to form an AlN bulk crystal without further preparation (e.g., without intermediate sublimation-recondensation steps).

Figure 1I:
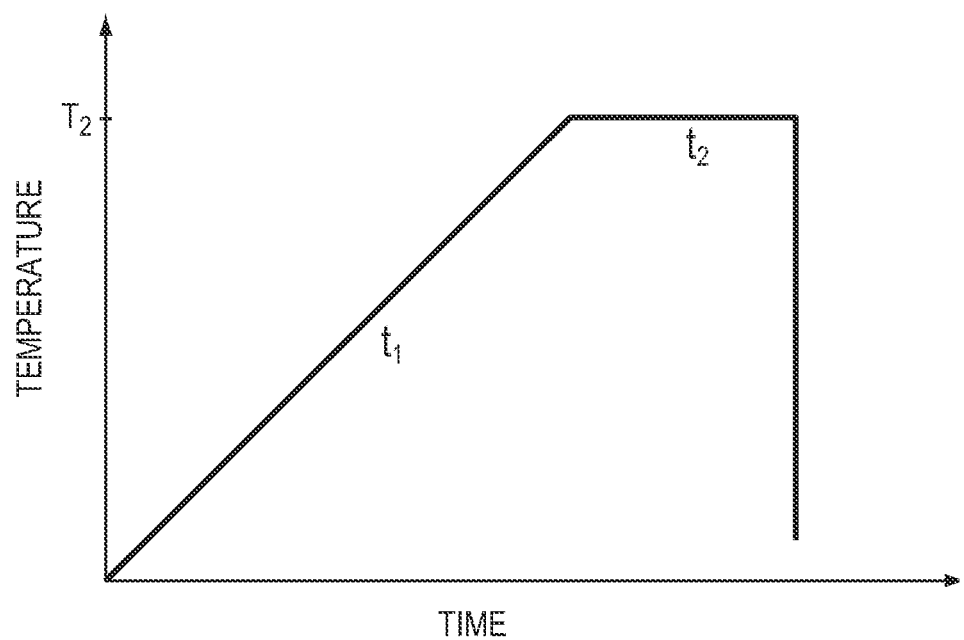

FIG. 1I schematically depicts an alternative to the heat treatment depicted in FIG. 1H in which a longer ramp to temperature T2 is utilized in place of the first annealing step at temperature T1. As shown in FIG. 1I, in accordance with various embodiments of the invention, the AlN ceramic (or portion thereof) may be ramped to temperature T2 (e.g., a temperature ranging from 2000° C. to 2250° C.) over a time period t1 ranging from, for example, 5 hours to 25 hours. Thereafter, the ceramic (or portion thereof) may be held at temperature T2 for a time period t2 of, for example, 3 hours to 25 hours. During the heat treatment, the ceramic (or portion thereof) is annealed and densified to form a polycrystalline AlN source material that may be utilized in the subsequent formation of high-quality single-crystal AlN bulk crystals. Because the polycrystalline AlN source material is generally approximately stoichiometric AlN with low concentrations of impurities, it may be used to form an AlN bulk crystal without further preparation (e.g., without intermediate sublimation-recondensation steps).

In various embodiments, the carbon concentration of the polycrystalline AlN source material, as measured by instrumental gas analysis (IGA), ranges from approximately $3.0 \times 10^{18}$ cm$^{-3}$ to approximately $1.8 \times 10^{19}$ cm$^{-3}$, approximately $3.8 \times 10^{18}$ cm$^{-3}$ to approximately $1.2 \times 10^{19}$ cm$^{-3}$, or even from approximately $3.0 \times 10^{18}$ cm$^{-3}$ to approximately $9.0 \times 10^{18}$ cm$^{-3}$. After the optional densification heat treatment, the density of the polycrystalline AlN source material, as measured by pycnometry at room temperature, may be approximately equal to that of single-crystal AlN, i.e., approximately 3.25 g/cm$^3$ to 3.26 g/cm$^3$. In various embodiments, the measured density of the AlN ceramic without the densification heat treatment may be lower, e.g., approximately 2.95 g/cm$^3$ to approximately 3.20 g/cm$^3$. In various embodiments, after the optional densification heat treatment, the polycrystalline AlN source material typically has an amber color and is composed of fairly large grains (e.g., average grain diameter ranging from approximately 0.1 mm to approximately 5 mm).

Figure 2:
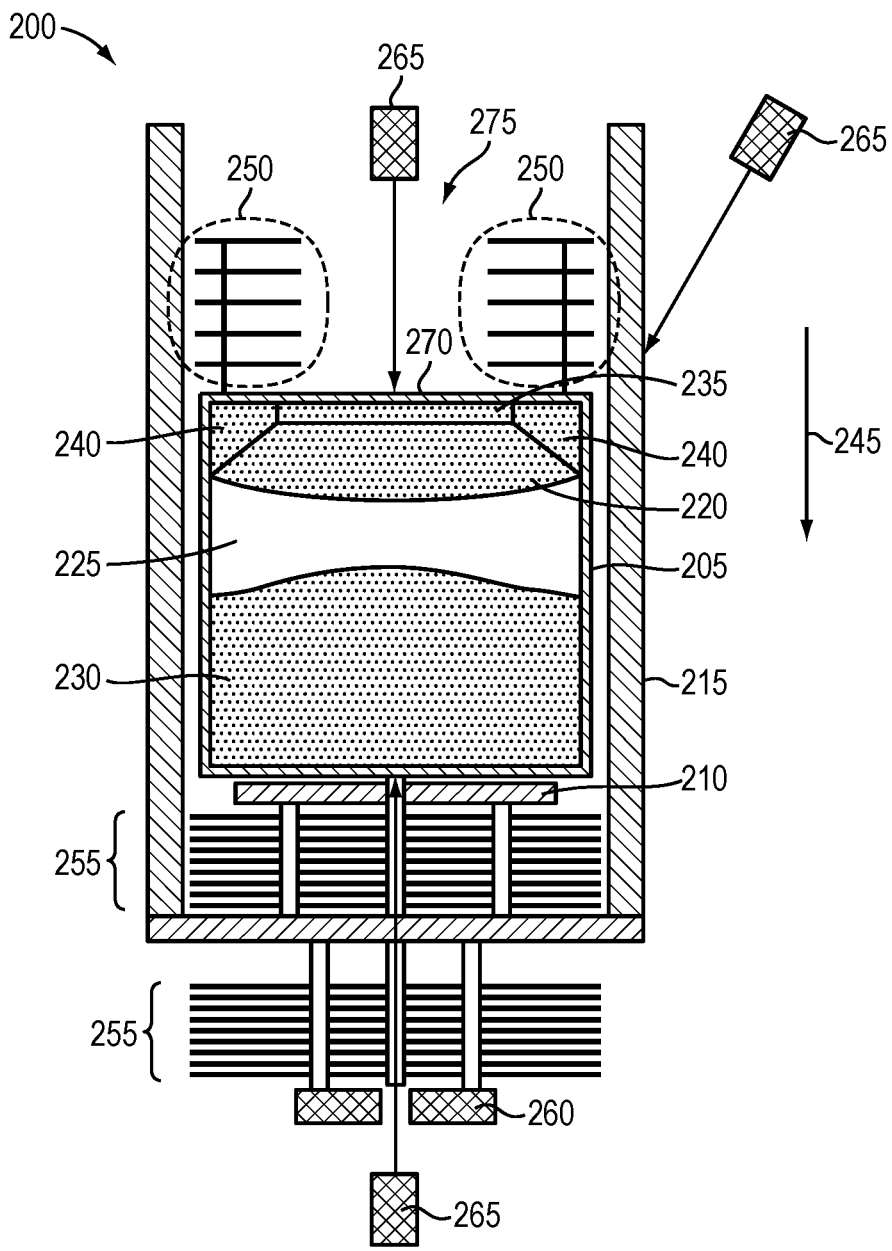
FIG. 2 is a schematic diagram of an apparatus for the growth of single-crystal AlN in accordance with various embodiments of the invention.

FIG. 2 depicts a crystal-growth apparatus 200 suitable for the growth of single-crystal AlN in accordance with various embodiments of the present invention. As shown, apparatus 200 includes a crucible 205 positioned on top of a crucible stand 210 within a susceptor 215. Both the crucible 205 and the susceptor 215 may have any suitable geometric shape, e.g., cylindrical. During a typical growth process, an AlN boule 220 is formed by condensation of a vapor 225 that includes or consists essentially of the elemental precursors of the AlN boule 220, i.e., Al and N atoms and/or N$_2$ molecules. In typical embodiments, the vapor 225 arises from the sublimation of a source material 230, which may include, consist essentially of, or consist of the polycrystalline AlN source material described above. The AlN boule 220 may form on and extend from a seed crystal 235. (Alternatively, the AlN boule 220 may nucleate upon and extend from a portion of the crucible 205 itself) The seed crystal 235 may be a single crystal (e.g., a polished wafer) including, consisting essentially of, or consisting of AlN. In various embodiments, the seed crystal 235 has a diameter (or width or other lateral dimension) of at least approximately 10 mm, at least approximately 25 mm, at least approximately 35 mm, or even at least approximately 50 mm. In various embodiments, the seed crystal 235 has a diameter (or width or other lateral dimension) of approximately 150 mm or less, and single-crystal AlN grown therefrom has a diameter (or width or other lateral dimension) of approximately 150 mm or less. In various embodiments, the crystalline orientation of the seed crystal 235 is substantially parallel to the c-axis. In other embodiments, the crystalline orientation of the seed crystal 235 is at least approximately 5°, or even at least approximately 10° away from the c-axis; the orientation of the seed crystal 235 may be toward a non-polar direction.

The crucible 205 may include, consist essentially of, or consist of one or more refractory materials, such as tungsten, rhenium, and/or tantalum nitride. As described in the '135 patent and the '153 patent, the crucible 205 may have one or more surfaces (e.g., walls) configured to selectively permit the diffusion of nitrogen therethrough and selectively prevent the diffusion of aluminum therethrough.

In accordance with embodiments of the invention, one or more internal parts of the crystal-growth apparatus 200 (e.g., the crucible 205, the susceptor 215, and/or the crucible stand 210) may be annealed before crystal growth and formation of AlN boule 220, and such annealing may advantageously decrease the carbon concentration (and/or the oxygen concentration) in the AlN boule 220. In various embodiments, the one or more internal parts of the crystal-growth apparatus 200 may be annealed at, for example, a temperature ranging from approximately 1000° C. to approximately 1800° C. for a time period of approximately 5 hours to approximately 50 hours.

In various embodiments of the invention, the concentration of oxygen and/or carbon within the AlN boule 220 may be decreased via the introduction of one or more gettering materials within the crucible 205 prior to and during growth of the AlN boule 220. The gettering materials may be introduced as a portion or all of one or more of the components of the crystal-growth apparatus 200 (e.g., the crucible 205, a liner situated within the crucible 205 and proximate an interior surface or wall thereof, the susceptor 215, and/or the crucible stand 210), and/or the gettering materials may be introduced as discrete masses of material within the crystal-growth apparatus 200. The gettering materials may be disposed between the source material 230 and the growing AlN boule 220 in order to, e.g., getter or absorb contaminants such as carbon and/or oxygen from the vapor flowing toward the AlN boule 220 (i.e., toward the seed crystal 235). In various embodiments, the gettering materials are stable at and have melting points greater than the growth temperature (e.g., greater than approximately 2000° C.) and have low vapor pressures to prevent contamination of the growing AlN boule 220 with the gettering materials themselves. In various embodiments, a gettering material has a eutectic melting point with AlN that is greater than the growth temperature (e.g., greater than approximately 2000° C.). Examples of gettering materials in accordance with embodiments of the present invention include boron (melting point of approximately 2300° C.), iridium (melting point of approximately 2410° C.), niobium (melting point of approximately 2468° C.), molybdenum (melting point of approximately 2617° C.), tantalum (melting point of approximately 2996° C.), rhenium (melting point of approximately 3180° C.), and/or tungsten (melting point of approximately 3410° C.). In various embodiments, the gettering material (or the component of the apparatus 200 or portion thereof) may include, consist essentially of, or consist of one or more non-tungsten materials having melting temperatures of at least approximately 2300° C.

In various embodiments, TaC material may be utilized as a gettering material to reduce oxygen concentration in the AlN single crystal; TaC may advantageously convert $Al_2O$ within the crystal-growth apparatus 200 to CO gas that is stable at the growth temperature for the AlN boule 220, as described in the Hartmann reference. In various embodiments, tungsten (e.g., one or more W plates) may be utilized as a gettering material to reduce carbon concentration in the AlN boule 220, as detailed in the Hartmann reference. As described in the Hartmann reference, TaC and W materials utilized in the crystal-growth apparatus 200 reduced oxygen and carbon concentrations within the resulting AlN crystal to about $7\times10^{18}$ $cm^{-3}$ and $1.5$-$2\times10^{18}$ $cm^{-3}$, respectively; the resulting UV absorption coefficient at 265 nm was 14 $cm^{-1}$, and the drop-off of the UV absorption coefficient from the AlN band edge was gradual. Thus, while the techniques described in the Hartmann reference may be beneficial to reduce contamination and resulting UV absorption to moderate levels, the use of such techniques alone appears to be insufficient to reduce the UV absorption of the AlN boule 220 to levels below 10 $cm^{-1}$ with a steep drop-off from the AlN band edge.

As shown in FIG. 2, during formation of the AlN boule 220, a polycrystalline material 240 may form at one or more locations within the crucible 205 not covered by the seed crystal 235. However, the diameter (or other radial dimension) of the AlN boule 220 may expand, i.e., increase, during formation of the AlN boule 220, thereby occluding the regions of polycrystalline material 240 from impinging vapor 225 and substantially limiting or even eliminating their growth. As shown in FIG. 2, the diameter of the AlN boule 220 may expand to (or even start out at, in embodiments utilizing larger seed crystals 235) be substantially equal to the inner diameter of the crucible 205 (in which case no further lateral expansion of the AlN boule 220 may occur). The length of the AlN boule 220 depends on one or more factors such as the side of the crucible 205, the amount of polycrystalline source material present in the crucible 205, and/or the growth time. In various embodiments, the length of the AlN boule 200 may be at least 0.5 cm, at least 1 cm, at least 2 cm, at least 5 cm, at least 10 cm, at least 20 cm, or at least 50 cm.

The growth of the AlN boule 220 along a growth direction 245 typically proceeds due to a relatively large axial thermal gradient (e.g., ranging from approximately 5° C./cm to approximately 100° C./cm) formed within the crucible 205. A heating apparatus (not shown in FIG. 2 for clarity), e.g., an RF heater, one or more heating coils, and/or other heating elements or furnaces, heats the susceptor 215 (and hence the crucible 205) to an elevated temperature typically ranging between approximately 1800° C. and approximately 2300° C. Prior to the onset of growth, the crucible 205 and its contents (i.e., seed crystal 235, if present, and source material 230) may be held at a temperature approximately equal to the desired growth temperature for a predetermined soak time (e.g., between approximately 1 hour and approximately 10 hours). In various embodiments, this soak at temperature stabilizes the thermal field within the crucible 205, promotes effective nucleation on the seed crystal 235, and promotes high-quality transition from nucleation to bulk growth of the single-crystalline AlN.

The apparatus 200 may feature one or more sets of top thermal shields 250, and/or one or more sets of bottom axial thermal shields 255, arranged to create the large axial thermal gradient (by, e.g., better insulating the bottom end of crucible 205 and the source material 230 from heat loss than the top end of crucible 205 and the growing AlN boule 220). During the growth process, the susceptor 215 (and hence the crucible 205) may be translated within the heating zone created by the heating apparatus via a drive mechanism 260 in order to maintain the axial thermal gradient near the surface of the growing AlN boule 220. One or more pyrometers 265 (or other characterization devices and/or sensors) may be utilized to monitor the temperature at one or more locations within susceptor 215. The top thermal shields 250 and/or the bottom thermal shields 255 may include, consist essentially of, or consist of one or more refractory materials (e.g., tungsten), and may be quite thin (e.g., between approximately 0.125 mm and 0.5 mm thick). As detailed in the '612 patent, the top thermal shields 250 and/or the bottom thermal shields 255 may be arranged in various configurations and/or have various characteristics (i.e., different numbers of shields, different spacings between shields, different thicknesses, different sized apertures defined therethrough, different sizes, etc.) in order to form a variety of different axial and radial thermal gradients within the crucible 205 and thus, the growth of the AlN boule 220 (e.g., the growth rate, the degree of radial expansion during growth, if any, etc.).

In various embodiments, the crucible 205 has a lid 270 with sufficient radiation transparency to enable at least partial control of the thermal profile within the crucible 205 via the arrangement of the top thermal shields 250. Furthermore, in embodiments featuring a seed crystal 235, the seed crystal 235 is typically mounted on the lid 270 prior to the growth of AlN boule 220. The lid 270 is typically mechanically stable at the growth temperature (e.g., up to approximately 2300° C.) and may substantially prevent diffusion of Al-containing vapor therethrough. Lid 270 generally includes, consists essentially of, or consists of one or more refractory materials (e.g., tungsten, rhenium, and/or tantalum nitride), and may be fairly thin (e.g., less than approximately 0.5 mm thick).

As shown in FIG. 2, each of the top thermal shields typically has an opening 275 therethrough. The opening 275 normally echoes the geometry and/or symmetry of the crucible 205 (e.g., the opening 275 may be substantially circular for a cylindrical crucible 205). The size of each opening 275 may be varied; typically, the size(s) range from a minimum of 10 mm to a maximum of approximately 5 mm (or even 2 mm) less than the diameter of the crucible 205.

For example, in an embodiment, five thermal shields 250, each having a diameter of 68.5 mm and an opening size (diameter) of 45 mm, are used. The thickness of each of the thermal shields 250 is 0.125 mm, and the thermal shields 250 are spaced approximately 7 mm from each other. At a typical growth temperature of 2065° C., this shield arrangement results in a radial thermal gradient (measured from the center of the semiconductor crystal to the inner edge of the crucible) of 27° C./cm.

As shown in FIG. 2, the top thermal shields 250 may have openings 275 larger than any such opening present in the bottom thermal shields 255, and/or the top thermal shields 250 may be stacked with one or more spacings between shields that are larger than that between the various bottom thermal shields 255. The spacings may range between approximately 1 mm and approximately 20 mm, or even between approximately 7 mm and approximately 20 mm. Also as shown, the openings 275 in the top thermal shields 250 may all be substantially equal to each other. Depending upon the desired growth conditions (e.g., pressure, temperature, crucible dimensions, distance between the seed crystal and the source material, etc.), the number of top thermal shields 250, the spacing between shields 250, and/or the size of the openings 275 may be varied to form the desired radial thermal gradient. The radial thermal gradient may even be varied in real time (e.g., via control of the power supplied to, and resulting temperature of, all or one or more portions of the furnace or heating elements thereof) during the growth of AlN boule 220, e.g., in response to feedback based on determination of the radial thermal gradient during growth. For example, the radial thermal gradient may be determined based on the temperatures of lid 270 and one or more sides of crucible 215 (e.g., measured by pyrometers 265 as shown in FIG. 2).

Similarly, although each of the top thermal shields 250 may have a thickness less than 0.5 mm, the thickness of one or more of the shields 250 may be varied with respect to the others. For example, one or more top thermal shields 250 may have a thickness of approximately 0.25 mm while one or more others have a thickness of approximately 0.125 mm. The thickness of the top thermal shields 250 may even be varied as a function of distance away from the lid 270 (i.e., either increasing or decreasing). Such thermal shields 250 having different thicknesses may be utilized to adjust the thermal field above and within the crucible 215. For example, a thicker shield may be used to block more radiative heat flow but will typically have higher thermal impact at temperatures where the heat flux is dominated by the thermal conductivity (lower temperatures, e.g. <1500°-1800°). Therefore, the resultant radial thermal gradient may vary as a function of growth temperature, even with the same arrangement of the same top thermal shields 250.

After growth of the AlN boule 220, the AlN boule 220 may be cooled down to approximately room temperature for subsequent removal from the crystal-growth apparatus 200. For example, the AlN boule 220 may be cooled in a two-stage process as described in the '519 patent. However, in various embodiments of the invention, the AlN boule 220 may simply be cooled down from the growth temperature in a single stage, at an arbitrary rate, as the heat treatment detailed below obviates the need for the two-stage process of the '519 patent. In fact, in various embodiments of the present invention, the AlN boule 220 is cooled down from the growth temperature to approximately room temperature at a high rate (e.g., greater than 70° C./hour, greater than 80° C./hour, greater than 100° C./hour, greater than 150° C./hour, greater than 200° C./hour, greater than 250° C./hour, greater than 300° C./hour, greater than 400° C./hour, or even greater than 500° C./hour; in various embodiments, the rate may be no more than 2000° C./hour, 1500° C./hour, or 1000° C.) without any "controlled cooling" achieved via application of power to the heating elements of crystal-growth apparatus 200. In various embodiments of the invention, gas (e.g., nitrogen and/or an inert gas) is flowed within the crystal-growth apparatus 200 at a high rate (e.g., a rate approximately equal to or higher than any gas-flow rate utilized during crystal growth) in order to cool the AlN boule 220. For example, the gas-flow rate utilized during crystal growth may be approximately 4 slm or less, approximately 3 slm or less, approximately 2 slm or less, or approximately 1 slm or less. The gas-flow rate utilized during crystal growth may be approximately 0.1 slm or more, approximately 0.5 slm or more, approximately 1 slm or more, or approximately 2 slm or more. In various embodiments, the gas-flow rate utilized during cooling may be approximately 5 slm or more, approximately 10 slm or more, approximately 15 slm or more, approximately 20 slm or more, or approximately 25 slm or more. The gas-flow rate utilized during cooling may be approximately 30 slm or less, approximately 25 slm or less, approximately 20 slm or less, approximately 15 slm or less, or approximately 10 slm or less. In addition, in embodiments of the invention, the crucible 205 (and thus the AlN boule 220 therewithin) may be moved to an edge of the hot zone, or above the hot zone, formed by the heating elements of the crystal-growth apparatus 200 in order to more rapidly cool the AlN boule 220.

Figure 3A:
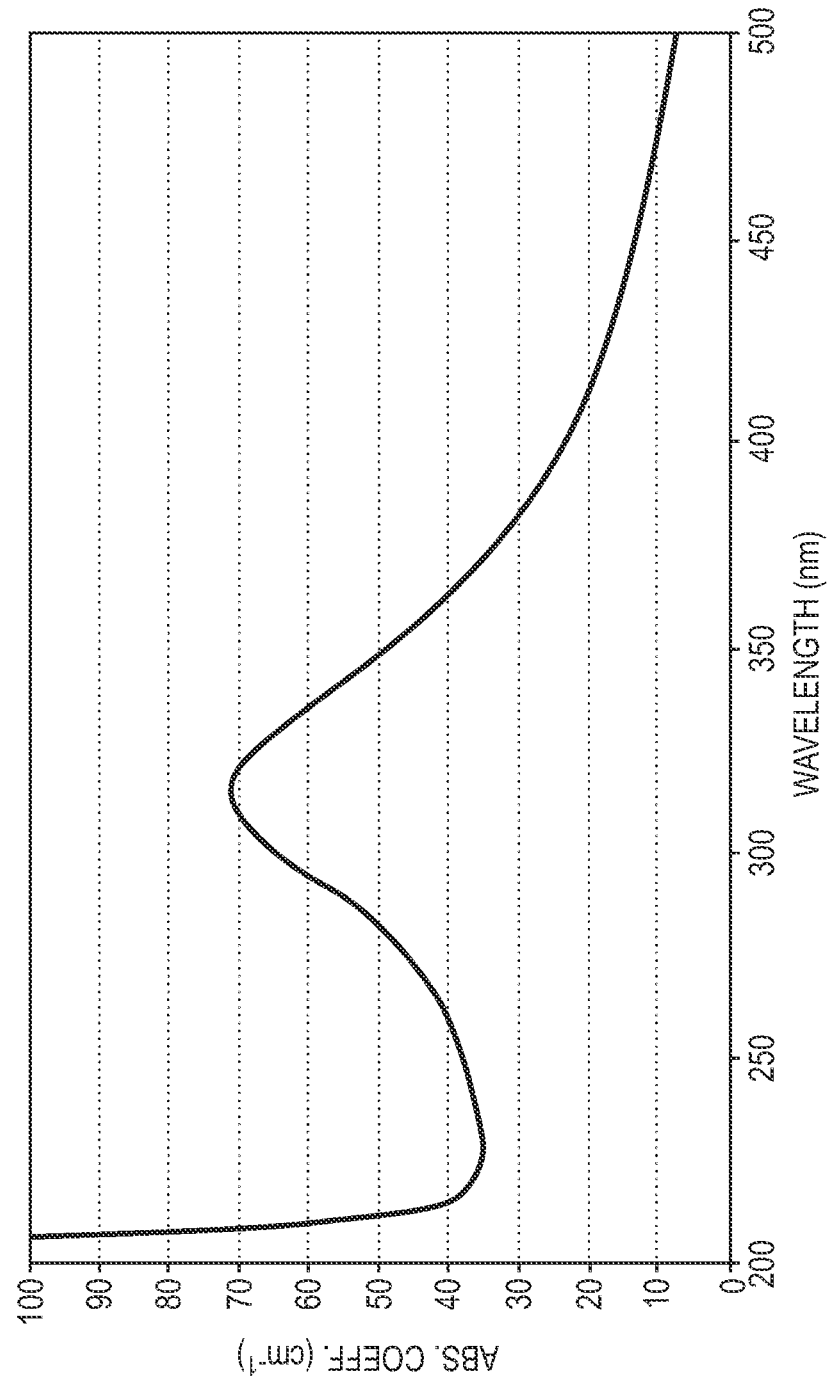
FIG. 3A is a graph of UV absorption coefficient, as a function of wavelength, for single-crystal AlN cooled quickly from the growth temperature in accordance with various embodiments of the invention.

Advantageously, the high-rate cooling of AlN boule 220 minimizes or eliminates the formation of cracks within the AlN boule 220, particularly when the AlN boule 220 has a diameter of approximately 50 mm or greater. However, the high cooling rate may also result in deleteriously high UV absorption within the AlN boule 220 at one or more wavelengths (e.g., wavelengths around approximately 310 nm). FIG. 3A depicts the UV absorption spectrum for an exemplary AlN boule 220 cooled quickly from the growth temperature as detailed herein. As shown, the spectrum exhibits an elevated peak at approximately 310 nm which impairs the UV transparency of the crystal over a wide range of wavelengths, and the UV absorption coefficient is greater than 20 cm$^{-1}$ over the entire wavelength range of 210 nm to 400 nm. The UV absorption coefficient is also greater than 30 cm$^{-1}$ over the wavelength range of 210 nm to 380 nm. Thus, in accordance with various embodiments of the present invention, control of various impurity concentrations (e.g., carbon and/or oxygen) during the growth of and within the resulting AlN crystal is insufficient to achieve low UV absorption coefficients, particularly at deep-UV wavelengths (e.g., between 210 nm and 280 nm, between 230 nm and 280 nm, or between 210 nm and 250 nm).

After cooling to room temperature, the AlN boule 220, or a portion thereof, may be heat treated to further improve its UV transparency, particularly at deep-UV wavelengths. For example, one or more substrates (or "wafers") may be separated from AlN boule 220, as detailed further below, and one or more of the substrates may be heat treated for improvement of UV transparency. The ensuing description refers to the heat treatment of the AlN boule 220, but it should be understood that only one or more portions of the boule (e.g., one or more substrates) may be heat treated, rather than the entire boule. In addition, the heat treatments detailed herein may be performed on various different AlN crystals (e.g., AlN single crystals), even if not initially grown and cooled as detailed herein, in order to improve UV absorption.

In various embodiments of the invention, the AlN boule 220 is annealed in a heating apparatus (e.g., a furnace such as a resistive furnace or a radio-frequency (RF) furnace) configured for substantially isothermal or quasi-isothermal heating. The interior of the furnace (at least in the heated, or "hot" zone), as well as any hardware (e.g., a platform or other support) within the furnace, may include, consist essentially of, or consist of one or more refractory materials (e.g., W or another refractory metal) having a melting point exceeding about 2800° C., or even exceeding about 3000° C. In various embodiments, the interior of the furnace (at least in the heated, or "hot" zone), and the hardware (e.g., a platform or other support) within the furnace, may be free of carbon, carbon-based or carbon-containing materials, graphite, quartz, alumina, and/or molybdenum. Before the AlN boule 220 is placed within the furnace, the furnace may undergo a bake-out run at high temperature to reduce or minimize the presence of any contaminants therewithin. For example, the furnace may be heated to about 2600° C. under vacuum for a time period of, e.g., approximately 0.5 hours to approximately 2 hours. After the furnace has cooled, the AlN boule 220 may be placed within the furnace, which may then be filled with nitrogen gas at a pressure of, e.g., approximately 1 bar to approximately 2 bars. The AlN boule 220 may be placed "loosely" (i.e., not attached, adhered, or fastened to) on a platform within the furnace that may include, consist essentially of, or consist of W or another refractory metal. In various embodiments, the loose placement of the AlN boule 220 reduces or substantially eliminates stresses due to any differential thermal expansion between AlN boule 220 and the platform.

The temperature within the furnace may then be ramped to the desired annealing temperature at a ramp rate of, e.g., approximately 1° C./min to approximately 50° C./min. In various embodiments, the annealing temperature is between approximately 2100° C. and approximately 2500° C., e.g., approximately 2400° C. In various embodiments, the annealing temperature is between approximately 2150° C. and approximately 2400° C. The present inventors have found that lower annealing temperatures (e.g., about 2000° C.) are generally insufficient to improve the UV transparency of AlN boule 220 at deep-UV wavelengths to the desired level. Once the desired annealing temperature has been achieved, the AlN boule 220 is annealed at that temperature for a time period of, for example, approximately 0.5 hour to approximately 100 hours, approximately 0.5 hour to approximately 5 hours, or approximately 1 hour. After annealing, the temperature of the furnace is slowly ramped down to an intermediate temperature (for example, between approximately 800° C. and approximately 1200° C., e.g., approximately 1000° C.) at a rate ranging between approximately 60° C./hour and approximately 120° C./hour. For example, the furnace may be cooled from an exemplary annealing temperature of 2200° C. to 1000° C. over a time period of 15 hours. Such slow cooling may be achieved via controlled application of heat with the furnace (e.g., at low power levels). Thereafter, the furnace may be turned off, and the furnace and the AlN boule 220 may be allowed to cool to room temperature. Thus, in various embodiments of the invention, the entire annealing cycle, including the cool-down therefrom, of the AlN boule 220 is performed in substantially isothermal or quasi-isothermal conditions.

As mentioned above, one or more substrates (or "wafers") may be separated from AlN boule 220 by the use of, e.g., a diamond annular saw or a wire saw, after (or, in some embodiments, before) annealing. In an embodiment, a crystalline orientation of a substrate thus formed may be within approximately 2° (or even within approximately 10, or within approximately 0.5°) of the (0001) face (i.e., the c-face). Such c-face wafers may have an Al-polarity surface or an N-polarity surface, and may subsequently be prepared as described in U.S. Pat. No. 7,037,838, the entire disclosure of which is hereby incorporated by reference. In other embodiments, the substrate may be oriented within approximately 2° of an m-face or a-face orientation (thus having a non-polar orientation) or may have a semi-polar orientation if AlN boule 220 is cut along a different direction. The surfaces of these wafers may also be prepared as described in U.S. Pat. No. 7,037,838. The substrate may have a roughly circular cross-sectional area with a diameter of greater than approximately 50 mm. The substrate may have a thickness that is greater than approximately 100 μm, greater than approximately 200 μm, or even greater than approximately 2 mm. The substrate typically has the properties of AlN boule 220, as described herein. After the substrate has been cut from the AlN boule 220, one or more epitaxial semiconductor layers and/or one or more light-emitting devices, e.g., UV-emitting light-emitting diodes or lasers, may be fabricated over the substrate, for example as described in U.S. Pat. Nos. 8,080,833 and 9,437,430, the entire disclosure of each of which is hereby incorporated by reference.

Figure 3B:
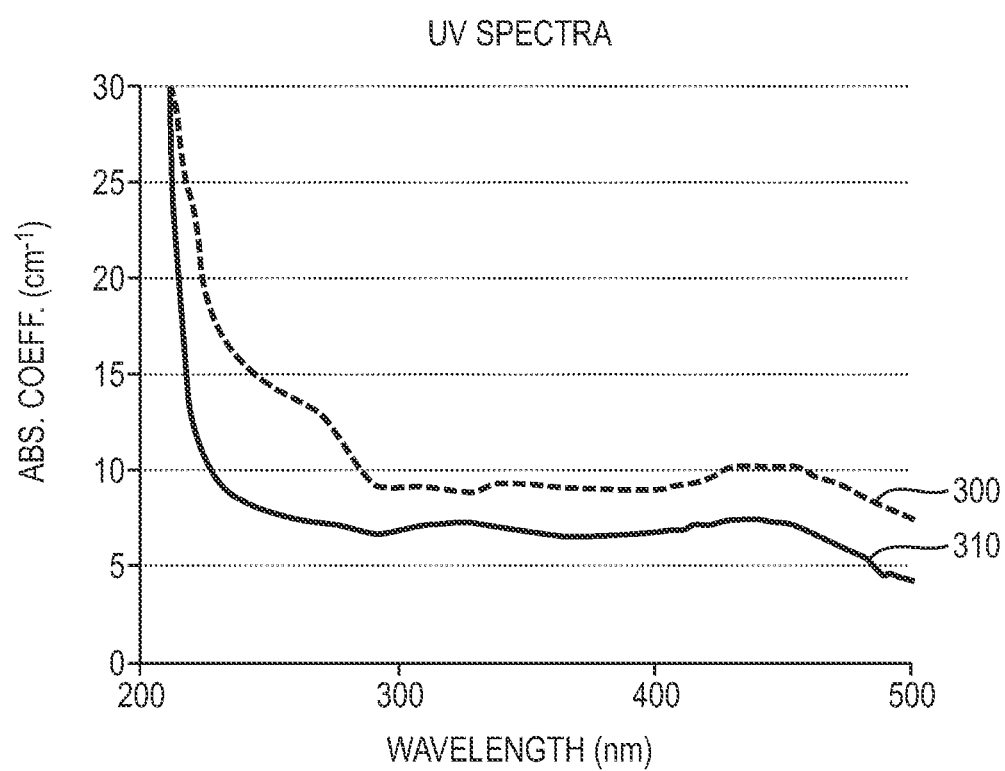
FIG. 3B is a comparative graph of UV absorption coefficients, as functions of wavelength, of conventional single-crystal AlN and single-crystal AlN grown and annealed in accordance with various embodiments of the invention.

FIG. 3B is a graphical comparison of a UV absorption spectrum 300, corresponding to the UV absorption spectrum from the '519 patent appearing in FIG. 1A and a UV absorption spectrum 310 of an AlN single crystal fabricated and annealed in accordance with embodiments of the present invention. As shown, over the entire range of wavelengths, the crystal in accordance with embodiments of the invention exhibits a lower absorption coefficient, and the spectrum is substantially constant (or "flat") for wavelengths between 210 nm and 280 nm. At about 230 nm, the crystal in accordance with embodiments of the invention has an absorption coefficient of less than 10 cm$^{-1}$ (in the depicted example, approximately 7 cm$^{-1}$-8 cm$^{-1}$), which is dramatically lower than the results achieved in either the '519 patent or the Hartmann reference. In addition, the slope of the absorption coefficient as a function of wavelength near the band edge is much steeper, as described in more detail below.

As mentioned above, embodiments of the present invention include and enable the production of single-crystal AlN having a steep drop-off in the absorption coefficient near the band edge, i.e., AlN having a low Urbach energy. The "Urbach tail" is the exponential part of the absorption coefficient curve near the optical band edge, and is related to crystalline disorder and localized electronic states extending into the band gap. The spectral dependence of the absorption coefficient ($\alpha$) and photon energy (hv) is known as Urbach empirical rule, which is given by the following equation:

$$\alpha = \alpha_0 \exp\left(\frac{hv}{E_U}\right)$$

(see Franz Urbach, "The Long-Wavelength Edge of Photographic Sensitivity and of the Electronic Absorption of Solids," Phys. Rev. 92 (1953) 1324, the entire disclosure of which is incorporated by reference herein). $\alpha_0$ is a constant, and $E_u$ is the Urbach energy, i.e., the energy of the band tail. The above equation may be rewritten as:

$$\ln \alpha = \ln \alpha_0 + \left(\frac{hv}{E_U}\right)$$

and the Urbach energy may be determined from the slope of the line when ln ($\alpha$) is plotted as a function of the incident photon energy hv; on such a plot, ln ($\alpha_0$) is the y-intercept of the line and thus corresponds to ln ($\alpha$) at a theoretical zero photon energy. Specifically, the Urbach energy is the inverse of the slope.

Figure 4:
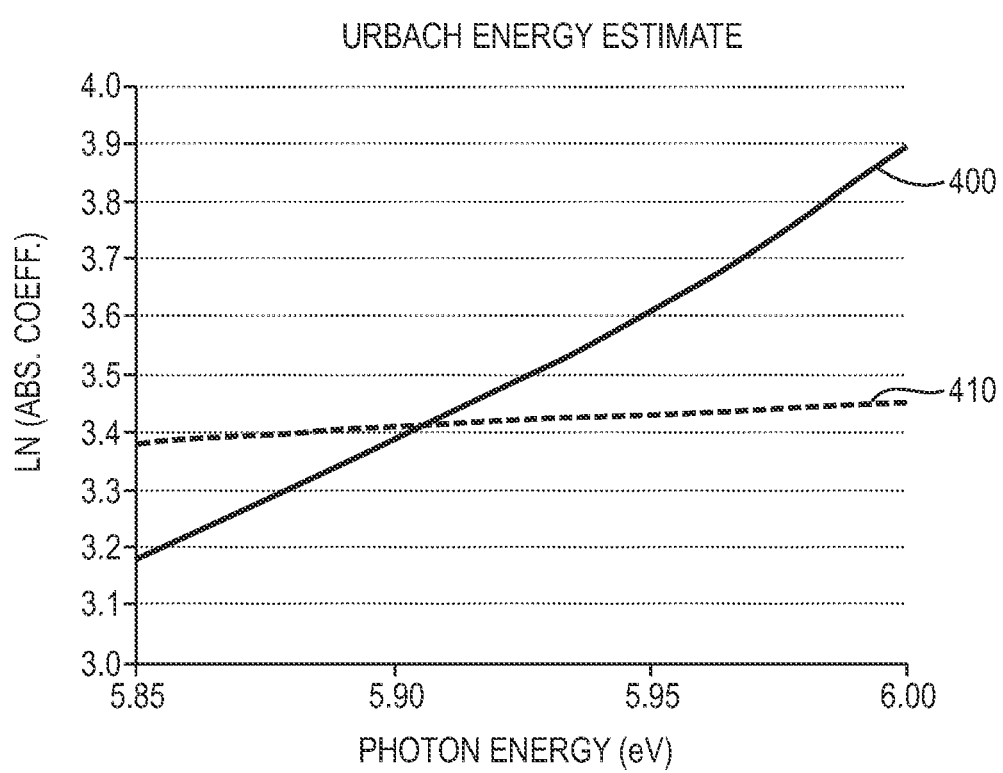
FIG. 4 is a graph utilized to estimate Urbach energies of the AlN samples of FIG. 3B in accordance with various embodiments of the invention.

FIG. 4 is a plot used to determine the Urbach energy of the sample from the '519 patent having the absorption spectrum presented in FIG. 1A (and, thus, absorption spectrum 300 presented in FIG. 3B) as well as the Urbach energy of the sample in accordance with embodiments of the invention having the absorption spectrum 310 presented in FIG. 3B. As shown, the slope of the resulting curve 400 for the inventive sample is much steeper (the slope is approximately 4.7/eV) and results in an Urbach energy of approximately 0.21 eV in the range of photon energies of 5.85 eV to 6.00 eV. In stark contrast, the curve 410 corresponding to the sample from FIG. 1A exhibits a slope of approximately 0.5/eV, which results in an Urbach energy of approximately 2.0 eV. In accordance with embodiments of the invention, the present inventors have fabricated samples having Urbach energies ranging from approximately 0.2 eV to approximately 1.8 eV, e.g., from approximately 0.21 eV to approximately 1.0 eV, which are significantly lower than those of conventional samples and samples reported in the literature.

Figure 5:
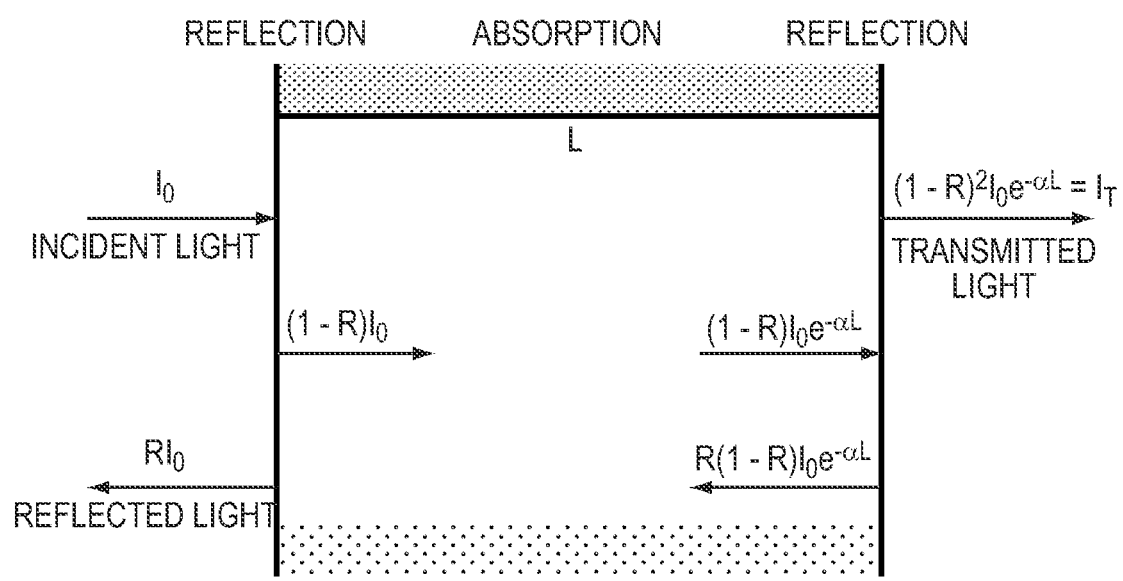
FIG. 5 is a schematic diagram of various components of light utilized to determine UV absorption spectra and Urbach energies in accordance with various embodiments of the invention.

In general, UV absorption spectra (and Urbach energies derived therefrom) may be determined by measuring reflections of incident light on a sample using a spectrometer. For example, the UV absorption spectra of samples in accordance with embodiments of the invention were measured using a V-670 (Class I) spectrometer and X-Y stage from Jasco Corporation. 52 points per sample were measuring utilizing a two-axis stage controller from Chuo Precision Industrial Co., Ltd. Wavelengths from 200 nm to 800 nm were measured, but measurements up to wavelengths of 2000 nm may be acquired utilizing this set-up. The absorption spectrum of a sample having a thickness L is estimated based on the light incident on the sample and the light transmitted by the sample, taking into account the light reflected back toward the light emission from both surfaces of the sample. The thickness L may be measured using, for example, a gauge (e.g., ACANTO, CERTO, METRO, or SPECTO length gauges, and associated GAGE-CHEK evaluation electronics, available from Heidenhain Corp. of Schaumburg, IL) or an optical system such as the ULTRA-MAP 100B or ULTRA-MAP C200, available from MicroSense, LLC of Lowell, MA. FIG. 5 summarizes this calculation, and absorption coefficient $\alpha$ at a particular wavelength of incident light $\lambda$ may be calculated from:

$$\frac{I_T}{I_0} = (1-R)^2 e^{-\alpha L}$$

where $I_T$ is the intensity of the transmitted light and $I_0$ is the intensity of the incident light. The reflectance R may be determined from:

$$R = \left(\frac{n-1}{n+1}\right)^2$$

where the refractive index n may be determined from the dispersion formula:

$$n^2 - 1 = 2.1399 + \frac{1.3786\lambda^2}{\lambda^2 - 0.1715^2} + \frac{3.861\lambda^2}{\lambda^2 - 15.03^2}$$

and where dispersion formula is provided from J. Pastrňák and L. Roskovcová, "Refraction index measurements on AlN single crystals," Phys. Stat. Sol. 14, K5-K8 (1966), the entire disclosure of which is incorporated by reference herein.

Embodiments of the present invention enable the fabrication of crack-free AlN bulk single crystals having large diameters (e.g., diameters ranging from approximately 25 mm to approximately 150 mm, or even approximately 50 mm to approximately 150 mm) and any of a host of various beneficial characteristics in addition to high UV transparency (particularly at deep-UV wavelengths). For example, AlN bulk crystals (e.g., boules and/or wafers) produced in accordance with embodiments of the present invention may have etch pit density measurements (i.e., etching measurements that reveal defects such as threading dislocations intersecting the surface of the crystal) ranging from approximately $5 \times 10^3$ cm$^{-2}$ to approximately $1 \times 10^4$ cm$^{-2}$. AlN crystals in accordance with embodiments of the present invention may have a density of threading edge dislocations ranging from approximately $1 \times 10^3$ cm$^{-2}$ to approximately $1 \times 10^4$ cm$^{-2}$ and a density of threading screw dislocations ranging from approximately 1 cm$^{-2}$ to approximately 10 cm$^{-2}$, e.g., a total threading dislocation density less than approximately $10^4$ cm$^{-2}$. When measured via x-ray diffraction, x-ray rocking curves (e.g., along (0002) and/or (10-12)) of AlN crystals in accordance with embodiments of the invention may have full width at half maximum (FWHM) values less than 50 arcsec (e.g., ranging from approximately 30 arcsec to approximately 50 arcsec, or from approximately 40 arcsec to approximately 50 arcsec). As measured by secondary ion mass spectroscopy (SIMS), AlN single crystals in accordance with embodiments of the invention may have carbon concentrations of approximately $1.8 \times 10^{16}$ cm$^{-3}$-$5 \times 10^{17}$ cm$^{-3}$, as well as oxygen concentrations of approximately $1 \times 10^{17}$ cm$^{-3}$-$7.9 \times 10^{17}$ cm$^{-3}$. In various embodiments, the carbon concentration may range from approximately $1.8 \times 10^{16}$ cm$^{-3}$ to approximately $5 \times 10^{16}$ cm$^{-3}$. The thermal conductivity of AlN single crystals in accordance with embodiments of the invention may be greater than approximately 290 Watts per meter-Kelvin (W/m·K), as measured by the American Society for Testing and Materials (ASTM) Standard E1461-13 (Standard Test Method for Thermal Diffusivity by the Flash Method), the entire disclosure of which is incorporated by reference herein, and provided by a commercial vendor such as NETZSCH Inc. of Exton, Pennsylvania.

Figure 6:
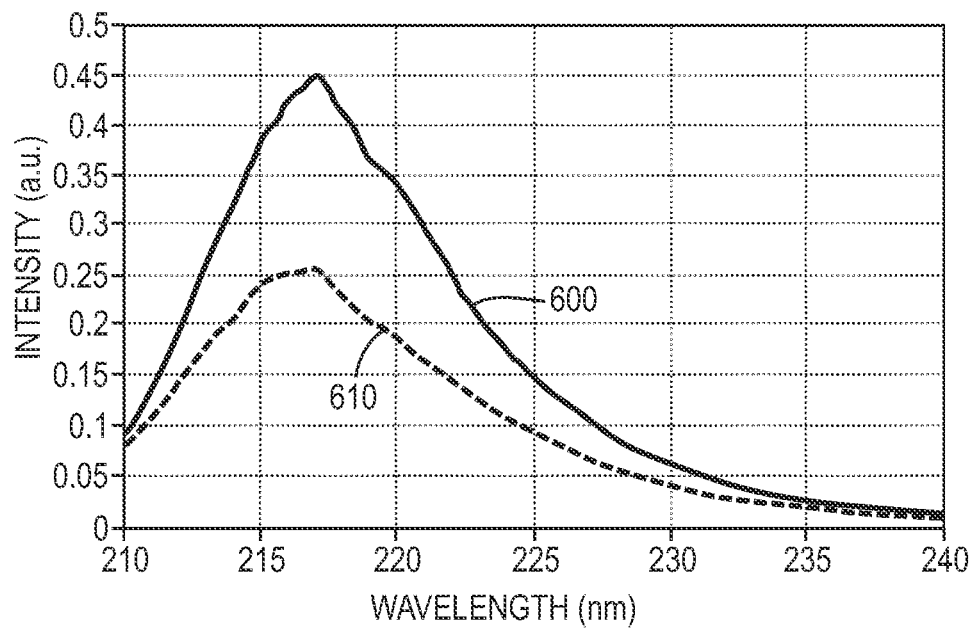
FIG. 6 is a comparative graph of emission intensity as a function of wavelength for simulated LEDs emitting light having a peak wavelength at about 217 nm in accordance with various embodiments of the invention.
Figure 7:
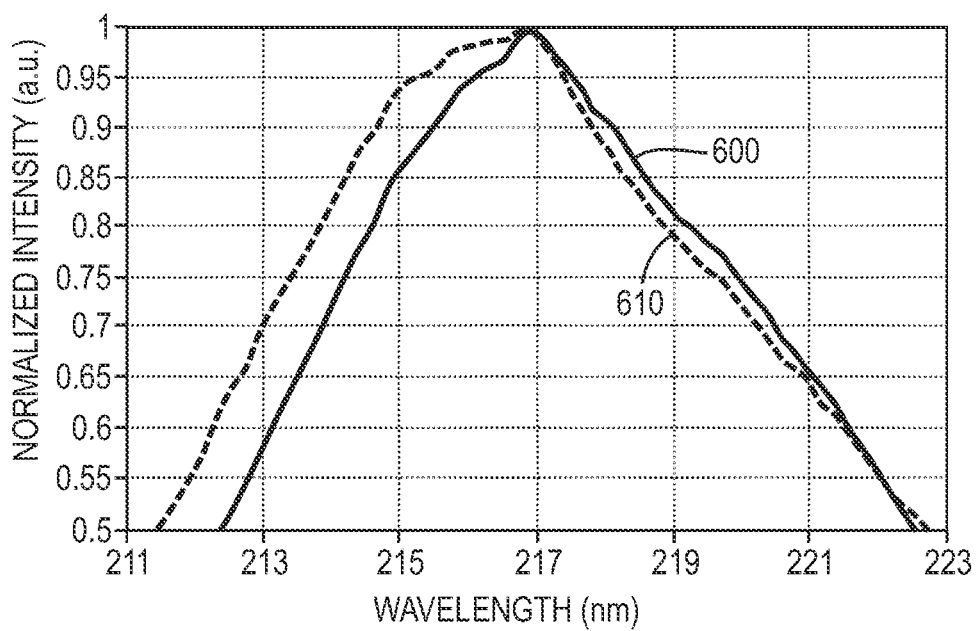
FIG. 7 is a comparative graph of the emission spectra of FIG. 6 in which the relative intensities of the LEDs have been independently normalized to the same value in order to demonstrate the narrower intensity peak of the device in accordance with embodiments of the present invention.

The improved UV absorption spectra of embodiments of the present invention enable enhanced performance of light-emitting devices (e.g., lasers and light-emitting diodes (LEDs)) fabricated on AlN substrates having the improved spectra, particularly at short wavelengths. FIG. 6 is a graph of LED device emission intensity as a function of wavelength for simulated LEDs emitting at about 217 nm. The top curve 600 is the emission intensity as a function of wavelength for an LED fabricated on a substrate having the improved absorption spectrum enabled by embodiments of the present invention—in this example, the UV absorption spectrum 310 depicted in FIG. 3B. The bottom curve 610 corresponds to the same LED structure fabricated on a substrate having the absorption spectrum of FIG. 1A (i.e., UV absorption spectrum 300 of FIG. 3B). As shown in FIG. 6, the emission intensity enabled by embodiments of the present invention is increased by nearly a factor of two at the peak emission wavelength of about 217 nm and is higher over the entire wavelength range. FIG. 7 is a graph of the same spectra over a smaller wavelength range, in which the relative intensities of the LEDs have been independently normalized to the same value in order to demonstrate the narrower intensity peak of the device in accordance with embodiments of the present invention. This narrower peak enables superior LED performance. The simulations for the devices depicted in FIGS. 6 and 7 indicate that the emission power for the device in accordance with embodiments of the invention will be increased by at least 1.6× for the substrate thickness of 0.55 mm utilized in the simulations. Due to the improved UV absorption, this advantage will be larger for larger substrate thicknesses. In addition, when reflectors are utilized to reflect light emitted by the device into a preferred direction, the power of the device will increase for each pass through the substrate traveled by the reflected light. For example, the improvement in device emission power enabled by embodiments of the present invention may be approximated as $2 \times (1.6)^3$, or approximately 8×, when reflected light traverses the substrate having the improved absorption spectrum three times.

Figure 8A:
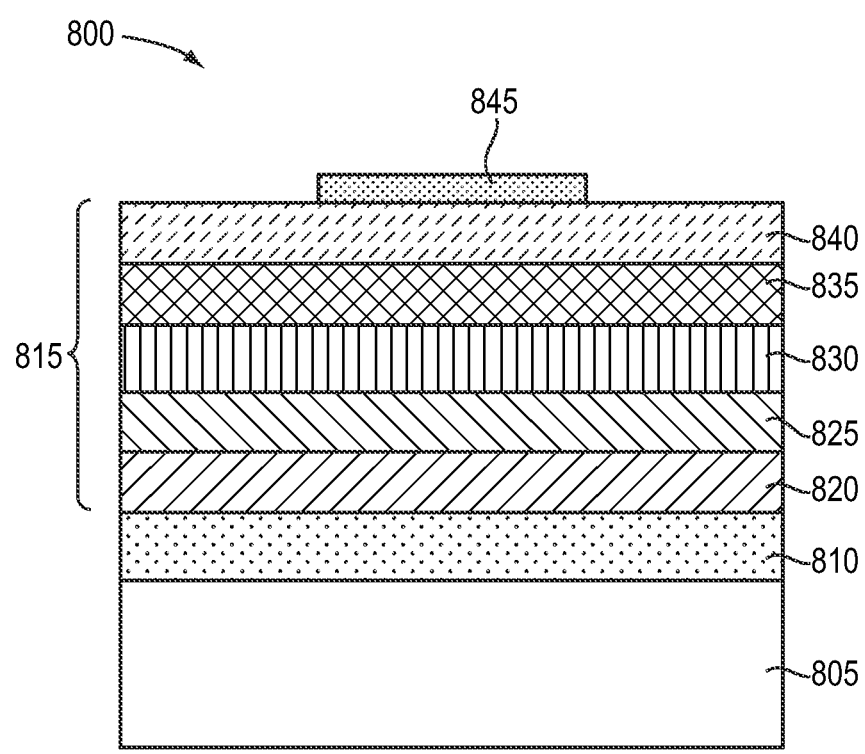
FIGS. 8A and 8B are schematic cross-sections of light-emitting devices in accordance with various embodiments of the invention.

FIG. 8A schematically depicts a light-emitting device structure 800 in accordance with embodiments of the present invention. Light-emitting device structures 800 in accordance with embodiments of the invention may include, consist essentially of, or consist of, for example, light-emitting diodes or lasers. As shown, the device structure 800 includes a substrate 805, which in various embodiments includes, consists essentially of, or consists of aluminum nitride, e.g., single-crystal aluminum nitride. In various embodiments, substrate 805 is a single-crystal substrate separated from single-crystalline AlN grown in accordance with embodiments of the invention after formation thereof. In various embodiments, the substrate 805 may not be transparent (at least not fully transparent) to all radiation emitted by the device structure 800 (e.g., UV radiation), depending upon the wavelength(s) emitted by device structure 800. Substrate 805 may be miscut such that the angle between its c-axis and its surface normal is between approximately 0° and approximately 4°. In various embodiments, the misorientation of the surface of substrate 805 is less than approximately 0.3°, e.g., for substrates 805 that are not deliberately or controllably miscut. In other embodiments, the misorientation of the surface of substrate 805 is greater than approximately 0.3°, e.g., for substrates 805 that are deliberately and controllably miscut. In various embodiments, the direction of the miscut is towards the a-axis.

The surface of substrate 805 may have a group-III (e.g., Al—) polarity, and may be planarized, e.g., by chemical-mechanical polishing. The RMS surface roughness of substrate 805 may be less than approximately 0.5 nm for a 10 μm×10 μm area. In some embodiments, atomic-level steps are detectable on the surface when probed with an atomic-force microscope. The threading dislocation density of substrate 805 may be measured using, e.g., etch pit density measurements after a 5 minute KOH—NaOH eutectic etch at 450° C. In various embodiments, the threading dislocation density is less than approximately $2 \times 10^3$ cm$^{-2}$. In some embodiments substrate 805 has an even lower threading dislocation density. Substrate 805 may be topped with a homoepitaxial layer (not shown) that may include, consist essentially of, or consist of doped or undoped AlN.

The various layers of device structure 800 disposed over substrate 805 may be formed by any of a variety of different techniques, e.g., epitaxial growth techniques such as chemical vapor deposition (CVD) methods such as metalorganic CVD (MOCVD).

In accordance with embodiments of the invention, an optional release layer 810 may be disposed over the substrate 805 to facilitate later removal of all or a portion of the substrate 805 from the rest of device structure 800, for example as described in U.S. patent application Ser. No. 15/977,031, filed on May 11, 2018 (the '031 patent application), the entire disclosure of which is incorporated by reference herein. In various embodiments, the release layer 810 is substantially lattice-matched to the substrate 805. Minimizing the lattice mismatch between the release layer 810 and the substrate 805 advantageously reduces or eliminates, for example, cracking and/or defect introduction in the release layer 810 and island formation (i.e., three-dimensional growth) during growth of the release layer 810. (As used herein, a layer that is "substantially lattice-matched" to a substrate or another layer has an unstrained lattice parameter sufficiently close to that of the substrate or other layer to enable epitaxial growth of the layer thereover such that the layer is approximately lattice-relaxed, or tensilely or compressively strained without significant strain relaxation (e.g., less than 20% relaxation, or even less than 10% relaxation), and/or to enable epitaxial growth of the layer without introduction of cracks and/or defects (e.g., dislocations) at densities exceeding those, if any, present in the underlying substrate or layer.) In various embodiments, the lattice mismatch between the release layer 810 and the substrate 805 is less than ±5%, less than ±3%, less than ±2%, less than ±1%, less than ±0.5%, less than 0.2%, or less than ±0.1%. In various embodiments, it may be preferable to reduce the lattice mismatch when the release layer 810 is tensilely strained (i.e., the unstrained, innate in-plane lattice spacing of the release layer 810 is smaller than that of substrate 805) in order to minimize or eliminate stress-relieving cracking in the release layer 810. In various embodiments, when the release layer 810 is compressively strained, the lattice mismatch to the substrate 805 may be larger but may be a function of the thickness of release layer 810. For example, compressively strained release layers 810 having too much lattice mismatch to the substrate 805 and too large a thickness may island during layer growth. Thus, in various embodiments, a release layer 810 having a compressive lattice mismatch with substrate 805 of approximately 3% may have a thickness no more than approximately 10 nm. For layers with less lattice mismatch, the thickness may be larger.

In various embodiments, the release layer 810 includes, consists essentially of, or consists of AlN or AlGaN doped with one or more impurities that form an absorption band within the release layer 810 for a wavelength of light not strongly absorbed by the substrate 805 itself. For example, the release layer 810 may include, consist essentially of, or consist of AlN doped with oxygen, which has an absorption band at approximately 310 nm. Since an AlN substrate 805 does not strongly absorb light having wavelengths larger than approximately 300 nm, absorption of light within, and concomitant local heating of, the release layer 810 may be utilized to remove the substrate 805 from the device structure 800. In various embodiments, the release layer 810 may be doped with oxygen (O) and/or one or more other dopants, for example, carbon (C), iron (Fe), manganese (Mn), or gadolinium (Gd). Such dopants may be introduced (e.g., as an additional gaseous species) during epitaxial growth of the release layer 810. In other embodiments, some or all of the dopant may be introduced after epitaxial growth of at least a portion of the release layer 810 by techniques such as ion implantation or dopant diffusion (e.g., from a solid or gaseous source). In various embodiments of the invention, one or more of the dopants may be introduced into and/or present within the release layer 810 at a concentration of at least for example, approximately $10^{17}$ cm$^{-3}$, at least approximately $10^{18}$ cm$^{-3}$, or even at least $10^{19}$ cm$^{-3}$. In various embodiments of the invention, one or more of the dopants may be introduced into and/or present within the release layer 810 at a concentration of at most for example, approximately $10^{20}$ cm$^{-3}$, or at most approximately $10^{21}$ cm$^{-3}$.

In exemplary embodiments, a release layer 810 including, consisting essentially, or consisting of AlN doped with oxygen may exhibit an absorption band at a wavelength of approximately 310 nm, and a release layer 810 including, consisting essentially, or consisting of AlN doped with carbon may exhibit an absorption band at a wavelength of approximately 265 nm. In such embodiments, radiation for substrate separation may be applied via, for example, a KrF laser (emission wavelength of approximately 248 nm) or a XeCl laser (emission wavelength of approximately 308 nm).

In various embodiments, release layer 810 may include, consist essentially of, or consist of a semiconductor other than AlN (e.g., AlGaN), and which may contain one or more dopants forming one or more absorption bands for light that is not strongly absorbed by substrate 805. In various embodiments, the release layer 810 may include, consist essentially of, or consist of a nitride alloy containing one or more of boron, aluminum, gallium, and/or indium. The release layer 810 may even include, consist essentially of, or consist of silicon carbide or a metal nitride (in which the metal is, e.g., one or more of Sc, Y, La, Ti, or Ta). For example, a release layer 810 including, consisting essentially, or consisting of silicon carbide may exhibit an absorption band at a wavelength of approximately 376 nm, and a release layer 810 including, consisting essentially, or consisting of titanium nitride may exhibit an absorption band at a wavelength of approximately 365 nm. In various embodiments, the release layer 810 is substantially lattice-matched to substrate 805.

In various embodiments, multiple release layers 810 may be present within device structure 300, and each release layer 810 may have one or more absorption bands different from one or all absorption bands in the other release layer(s) 810. For example, multiple release layers 810 including, consisting essentially of, or consisting of AlN or AlGaN may be formed (e.g., epitaxially grown), where each release layer 810 is doped with a different one of the dopants referred to above. In various embodiments, one or more release layers 810 may be tensilely strained with respect to the substrate 805, and/or one or more release layers 810 may be compressively strained with respect to the substrate 805.

In various embodiments of the invention, release layer 810 is not present within the device structure 800. As detailed herein, substrates 805 prepared in accordance with embodiments of the invention may have beneficially low UV absorption coefficients, particularly at deep-UV wavelengths. Thus, removal of all or a portion of the substrate 805 may be unnecessary for device structure 800 (particularly, for example, device structures 800 configured to emit light in the deep-UV wavelength regime) to exhibit surprisingly high performance and efficiency.

Device structure 800 also includes an active light-emitting structure 815 disposed over the release layer 810, if the release layer 810 is present, as shown in FIG. 8A. For example, the active structure 815 may include a bottom contact layer 820. In various embodiments, the bottom contact layer 820 is n-type doped, e.g., doped with an impurity such as P, As, Sb, C, H, F, O, Mg, and/or Si. The bottom contact layer 820 may include, consist essentially of, or consist of, for example, AlN or $Al_xGa_{1-x}N$. In an embodiment, an optional graded buffer layer (not shown) is disposed above substrate 805 and below bottom contact layer 820 (and, in various embodiments, below the release layer 810, if the release layer 810 is present). The graded buffer layer may include, consist essentially of, or consist of one or more semiconductor materials, e.g., $Al_xGa_{1-x}N$. In various embodiments, the graded buffer layer has a composition approximately equal to that of substrate 805 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 820 (or release layer 810, if present) may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x ranging from approximately 60% to approximately 85%.

The bottom contact layer 820 may have a thickness sufficient to prevent current crowding after device fabrication and/or to stop on during etching to fabricate contacts. For example, the thickness of bottom contact layer 820 may range from approximately 100 nm to approximately 500 nm, or from approximately 100 nm to approximately 2 µm. When utilizing a bottom contact layer 820, the final light-emitting device may be fabricated with back-side contacts. In various embodiments, bottom contact layer 820 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 815 is configured for the emission of light in response to an applied voltage. Thus, the active structure 815 may include a multiple-quantum well ("MQW") layer 825 disposed above bottom contact layer 820. In various embodiments, MQW layer 825 is disposed directly on the bottom contact layer 820. In other embodiments, an optional layer (e.g., an undoped layer including, consisting essentially of, or consisting of an undoped semiconductor material such as AlGaN) may be disposed between the bottom contact layer 820 and the MQW layer 825. The MQW layer 825 may be doped with the same doping polarity as the bottom contact layer 820, e.g., n-type doped. The MQW layer 825 may include, consist essentially of, or consist of one or more quantum wells separated by (or surrounded on both sides by) barriers. For example, each period of MQW layer 825 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 825 may include a plurality of such periods, and may have a total thickness ranging from 20 nm to 100 nm, or less than approximately 50 nm. In various embodiments of the invention, the active light-emitting structure 815 is configured to (e.g., has a MQW layer 825 having layer composition(s) selected to) emit ultraviolet light.

In various embodiments of the invention, an electron-blocking layer 830 may be disposed over MQW layer 825. The electron-blocking layer 830 typically has a wider band gap than that of a band gap within the MQW layer 825 (e.g., a band gap of the barrier layers therewithin). In various embodiments, the electron-blocking layer 830 may include, consist essentially of, or consist of e.g., $Al_xGa_{1-x}N$, and electron-blocking layer 830 may be doped. For example, the electron-blocking layer 830 may be doped with the same doping polarity as that of bottom contact layer 820 and/or MQW layer 825 (e.g., n-type doped). In various embodiments, the value of x in the electron-blocking layer 830 is greater than the value of the Al mole fraction in the barrier layers used in the MQW layer 825. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 830 may have a thickness that may range, for example, between approximately 10 nm and approximately 50 nm, or even between approximately 10 nm and approximately 30 nm. In various embodiments of the invention, the electron-blocking layer 830 is sufficiently thin (e.g., thickness less than about 30 nm, or less than about 20 nm) so as to facilitate carrier (e.g., hole) tunneling through the electron-blocking layer 830. In various embodiments of the invention, the electron-blocking layer 830 is omitted from device structure 800.

As shown in FIG. 8A, device structure 800 may also include a graded layer 835 disposed above the electron-blocking layer 830 (or above the MQW layer 825 in embodiments in which electron-blocking layer 830 is omitted), and a cap layer (or "top contact layer") 840 may be disposed over the graded layer 835. The cap layer 840 may be doped with a doping polarity opposite of that of the bottom contact layer 820, e.g., p-type doped with one or more dopants such as Mg, Be, and/or Zn. In other embodiments, the cap layer 840 may be undoped, as carriers (e.g., holes) may be injected from an electrode into a two-dimensional carrier gas disposed at the interface between the cap layer 840 and the graded layer 835. (While in exemplary embodiments described herein the cap layer 840 is doped p-type and the bottom contact layer 820 is doped n-type, embodiments in which the doping polarities of these layers are switched are within the scope of the present invention; in such embodiments, the electron-blocking layer 830, if present, may be considered to be a "hole-blocking layer," as understood by those of skill in the art.) The cap layer 840 may have a thickness ranging from, e.g., approximately 1 nm to approximately 100 nm, or approximately 1 nm to approximately 50 nm, or approximately 1 nm to approximately 20 nm. In various embodiments, the cap layer 840 includes, consists essentially of, or consists of $Al_xGa_{1-x}N$, and in various embodiments the aluminum concentration x may range from 0 (i.e., pure GaN) to approximately 0.2.

The device structure 800 may also incorporate one or more metallic contacts to facilitate electrical contact to the device. For example, one metallic contact may include or consist essentially of an electrode layer 845 disposed above or on the cap layer 840. The composition and/or shape of the electrode layer 845 are not particularly limited as long as it enables the injection of carriers (e.g., holes) into the cap layer 840. In embodiments in which holes are injected into a p-type doped nitride-based semiconductor cap layer 840, the electrode layer 845 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). In embodiments in which electrons are injected into an n-type doped nitride-based semiconductor cap layer 840, the electrode layer 845 may include, consist essentially of, or consist of one or more metals, e.g., Ti, Al, Au, Pt, Ni, and/or V, alloys or mixtures of two or more of these metals, or oxide-based and/or transparent electrode materials such as indium tin oxide (ITO). Electrode layers 845 in accordance with embodiments of the invention are not limited to these materials. The thickness of the electrode layer 845 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 845 is formed after removal of all or a portion of the substrate 805.

Figure 8B:
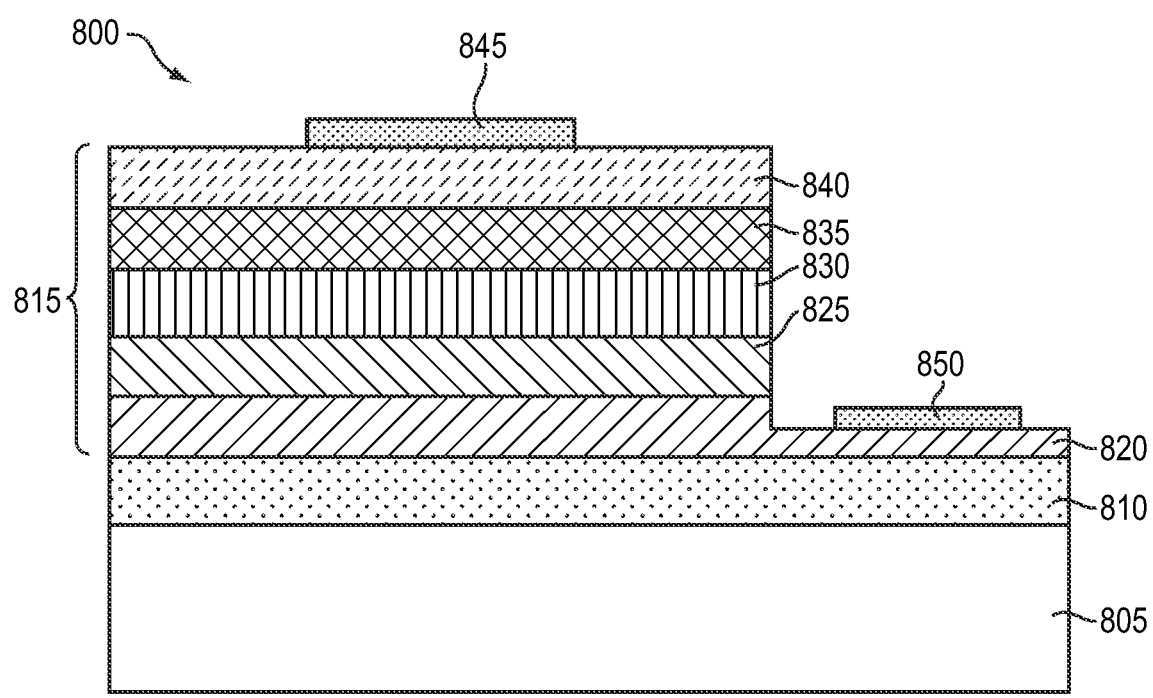

In various embodiments, a second electrode layer 850 may be formed in electrical contact with (and, in various embodiments, direct mechanical contact with) the bottom contact layer 820, even if the substrate 805 is not removed, as shown in FIG. 8B; such an electrode layer 850 may be considered to be a "bottom electrode layer." For example, a portion of the active structure 815 may be removed by, e.g., conventional photolithography and wet and/or dry etching, in order to reveal at least a portion of the bottom contact layer 820. The second electrode layer 850 may then be deposited on the bottom contact layer. The composition and/or shape of the bottom electrode layer 850 are not particularly limited as long as it enables the injection of carriers (e.g., electrons) into the bottom contact layer 820. In embodiments in which electrons are injected into an n-type doped nitride-based semiconductor bottom contact layer 820, the bottom electrode layer 850 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 820, the bottom electrode layer 850 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 850 in accordance with embodiments of the invention are not limited to these materials. The thickness of the bottom electrode layer 850 may be, for example, between approximately 10 nm and approximately 100 nm, or between approximately 10 nm and approximately 50 nm, or between approximately 10 nm and approximately 30 nm, or between approximately 25 nm and approximately 40 nm.

As mentioned above, embodiments of the present invention feature a graded layer 835 disposed between the cap layer 840 and the electron-blocking layer 830 (or the MQW layer 815 in embodiments in which the electron-blocking layer 830 is omitted). The graded layer 835 typically includes, consists essentially of, or consists of a nitride semiconductor, e.g., a mixture or alloy of Ga, In, and/or Al with N. The compositional gradient within graded layer 835 may be substantially continuous or stepped, and the grading rate within the graded layer 835 may be substantially constant or may change one or more times within the thickness of graded layer 835. The graded layer 835 may be undoped. In other embodiments, the graded layer 835 is doped n-type or p-type with one or more dopants, e.g., C, H, F, O, Mg, Be, Zn, and/or Si. The thickness of the graded layer 835 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 800 may be temporarily halted between growth of the graded layer 835 and the underlying layer and/or the overlying layer. In various embodiments, the graded layer 835 is pseudomorphically strained to one or more of the underlying layers and/or to the substrate 805.

In various embodiments of the invention, one or more (or even all) of the layers of device structure 800 formed over substrate 805 may be pseudomorphically strained, similar to device layers described in U.S. Pat. No. 9,437,430, filed on Jan. 25, 2008, U.S. Pat. No. 8,080,833, filed on Apr. 21, 2010, and U.S. Pat. No. 9,299,880, filed on Mar. 13, 2014, the entire disclosure of each of which is incorporated by reference herein. Thus, as detailed therein, in various embodiments, one or more of the layers of device structure 800 may be pseudomorphic and may have a thickness greater than its predicted (e.g., via the Maxwell-Blakeslee theory) critical thickness. Moreover, the collective layer structure of device structure 800 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 800 are pseudomorphically strained and cap layer 840 is partially or substantially fully relaxed. For example, the lattice mismatch between cap layer 840 and substrate 805 and/or MQW layer 835 may be greater than approximately 1%, greater than approximately 2%, or even greater than approximately 3%. In an exemplary embodiment, cap layer 840 includes, consists essentially of, or consists of undoped or doped GaN, substrate 805 includes, consists essentially of, or consists of doped or undoped single-crystalline AlN, and MQW layer 825 includes, consists essentially of, or consists of multiple $Al_{0.55}Ga_{0.45}N$ quantum wells interleaved with $Al_{0.75}Ga_{0.25}N$ barrier layers, and cap layer 840 is lattice mismatched by approximately 2.4%. Cap layer 840 may be substantially relaxed, i.e., may have a lattice parameter approximately equal to its theoretical unstrained lattice constant. A partially or substantially relaxed cap layer 840 may contain strain-relieving dislocations having segments threading to the surface of cap layer 840 (such dislocations may be termed "threading dislocations"). The threading dislocation density of a relaxed cap layer 840 may be larger than that of substrate 805 and/or layers underlying cap layer 840 by, e.g., one, two, or three orders of magnitude, or even more.

In accordance with embodiments of the present invention, application of light (e.g., laser light) and/or heat may be utilized to separate all or a portion of the substrate 805 from the rest of device structure 800, as detailed in the '031 patent application. Before such substrate separation, the device structure 800 may be attached to a handle wafer (not shown) by, for example, wafer bonding or an adhesive material. In various embodiments, the device structure 800 may be wafer bonded to the handle wafer via use of an intermediate material such as, for example, photoresist (e.g., SU-8), glass frit, an organic material such as benzocyclobutene (BCB), etc. Wafer bonding techniques, including reversible ones (i.e., techniques in which the handle wafer is straightforwardly removed after bonding and processing) are known to those of skill in the art and may be accomplished without undue experimentation. The handle wafer may be at least substantially transparent to light emitted by the active structure 815 and/or to light utilized to separate substrate 805 (e.g., via absorption within release layer 810). The handle wafer may include, consist essentially of, or consist of, for example, one or more semiconductor materials, sapphire, quartz, etc. For substrate separation, heat and/or light having a wavelength corresponding to an absorption band within release layer 810 (e.g., approximately 310 nm for oxygen-doped AlN) may be emitted into the device structure 800 (e.g., from below the substrate 805 and/or from one or more sides of the bonded structure). (As utilized herein, a wavelength "corresponding to" an absorption band is sufficiently close to the absorption band such that an amount of the light sufficient to effect at least partial release of an underlying substrate and/or layer is absorbable within the layer having the absorption band.) In various embodiments, the light is primarily composed of or contains a wavelength that is within ±20 nm, within ±10 nm, within ±5 nm, within ±2 nm, or within ±1 nm of the wavelength of an absorption band within the release layer 810. In various embodiments, the release layer 810 may have more than one absorption band (due to, e.g., introduction of two or more different dopants), and the light may be primarily composed of or contain one or more wavelengths that are within ±20 nm, within ±10 nm, within ±5 nm, within ±2 nm, or within ±1 nm of the wavelength of one or more of the absorption bands within the release layer 810. Absorption of the light and/or heat within the release layer 810 results in local heating within the release layer 810, which may be magnified for release layers 810 having lower thermal conductivity. The local heating results in crack formation and subsequent fracture within the release layer 810 and/or at the interface between release layer 810 and substrate 805, thereby removing the substrate 805 (or at least a portion thereof) from device structure 800. In various embodiments of the invention, the light may be applied at a fluence ranging from, for example, approximately 500 mJ/cm$^2$ to approximately 1000 mJ/cm$^2$. In various embodiments of the invention, the light may be applied as one or more pulses. Such pulses may have durations ranging from, for example, approximately 10 ms to approximately 100 ms.

In various embodiments, at least a portion of the release layer 810 remains attached to the device structure 800 upon removal of the substrate 805. After removal of the substrate 805, any remaining portion of the release layer 810 may be removed (e.g., by selective etching or grinding and/or polishing). A metallic contact may be formed in contact with the bottom contact layer 820, and the device structure 800 may be utilized to emit light without absorption thereof by substrate 805. The metallic contact may be formed on the "bottom" surface of the bottom contact layer 820 (i.e., the surface of the bottom contact layer 820 opposite the top contact layer), or a portion of the structure may be etched away so that the metallic contact may be formed on a thusly revealed "top" surface of the bottom contact layer (i.e., the surface of the bottom contact layer 820 opposite the prior location of substrate 805). In various embodiments, any handle wafer used in the substrate-separation process is removed from the device structure 800, while in other embodiments, the handle wafer remains attached to the device structure 800.

Figure 9A:
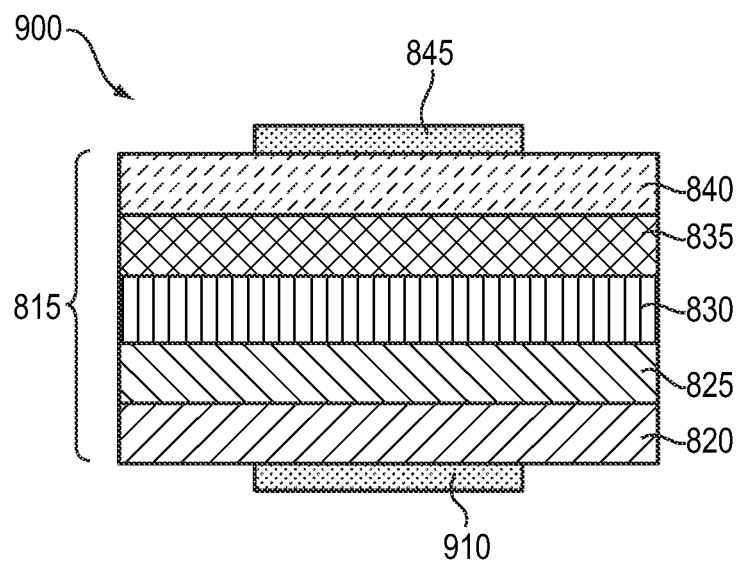
FIGS. 9A and 9B are schematic cross-sections of light-emitting devices after substrate removal in accordance with various embodiments of the invention.
Figure 9B:
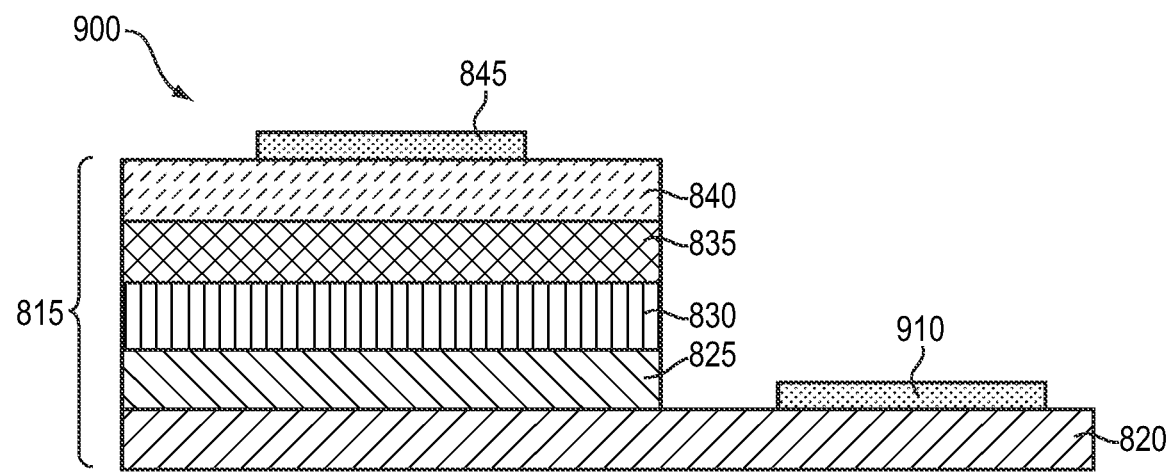

As mentioned, after removal of all or a portion of the substrate 805, electrical contacts may be made to the bottom contact layer 820 and the cap layer 840 so that power may be applied to the device structure 800, resulting in light emission therefrom. FIGS. 9A and 9B depict different device structures 900 in accordance with various embodiments, in which a bottom electrode layer 910 is formed below the newly exposed bottom contact layer 820 after removal of the substrate 805 (FIG. 9A) and on top of a portion of bottom contact layer 820 after removal of the substrate 805 and masking and removal of a portion of the active structure 815 (FIG. 9B). The composition and/or shape of the bottom electrode layer 910 are not particularly limited as long as it enables the injection of carriers (e.g., electrons) into the bottom contact layer 820. In embodiments in which electrons are injected into an n-type doped nitride-based semiconductor bottom contact layer 820, the bottom electrode layer 910 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 820, the bottom electrode layer 910 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 910 in accordance with embodiments of the invention are not limited to these materials. The thickness of the bottom electrode layer 910 may be, for example, between approximately 10 nm and approximately 100 nm, or between approximately 10 nm and approximately 50 nm, or between approximately 10 nm and approximately 30 nm, or between approximately 25 nm and approximately 40 nm.

After formation of the electrodes 845 and/or 910, the resulting light-emitting device may be electrically connected to a package, for example as detailed in U.S. Pat. No. 9,293,670, filed on Apr. 6, 2015 (the '670 patent), the entire disclosure of which is incorporated by reference herein. A lens may also be positioned on the device to transmit (and, in various embodiments, shape) the light emitted by the device. For example, a rigid lens may be disposed over the device as described in the '670 patent or in U.S. Pat. No. 8,962,359, filed on Jul. 19, 2012, or in U.S. Pat. No. 9,935,247, filed on Jul. 23, 2015, the entire disclosure of each of which is incorporated by reference herein. After packaging, any handle wafer remaining on the active structure 815 may be removed.

In accordance with embodiments of the invention, other techniques for partial or complete substrate removal may be utilized if desired. For example, etching techniques, such as electrochemical etching techniques described in U.S. patent application Ser. No. 16/161,320, filed on Oct. 16, 2018, the entire disclosure of which is incorporated by reference herein, may be utilized.

Figure 10A:
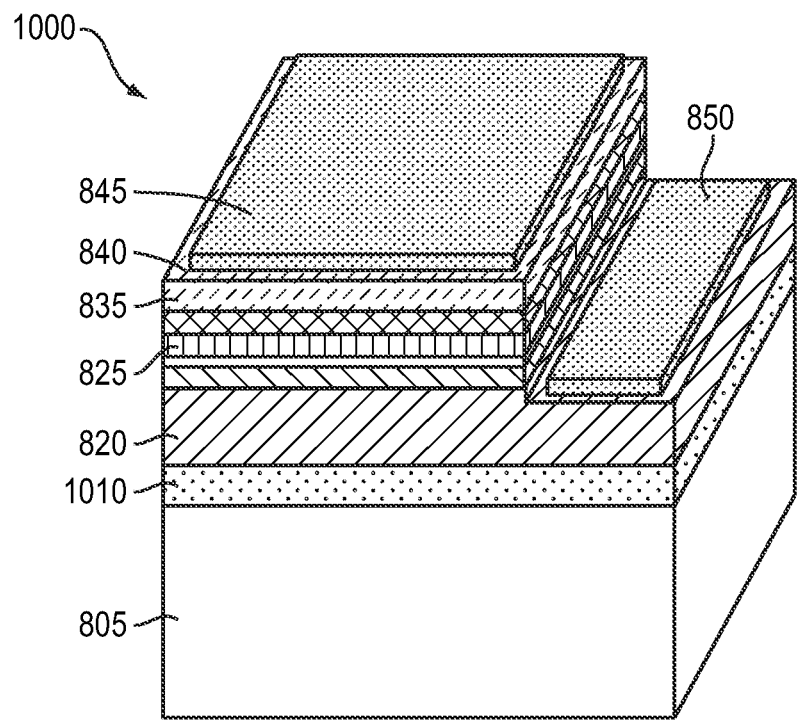
FIG. 10A is a schematic diagraph of a light-emitting device fabricated in accordance with various embodiments of the invention.
Figure 10B:
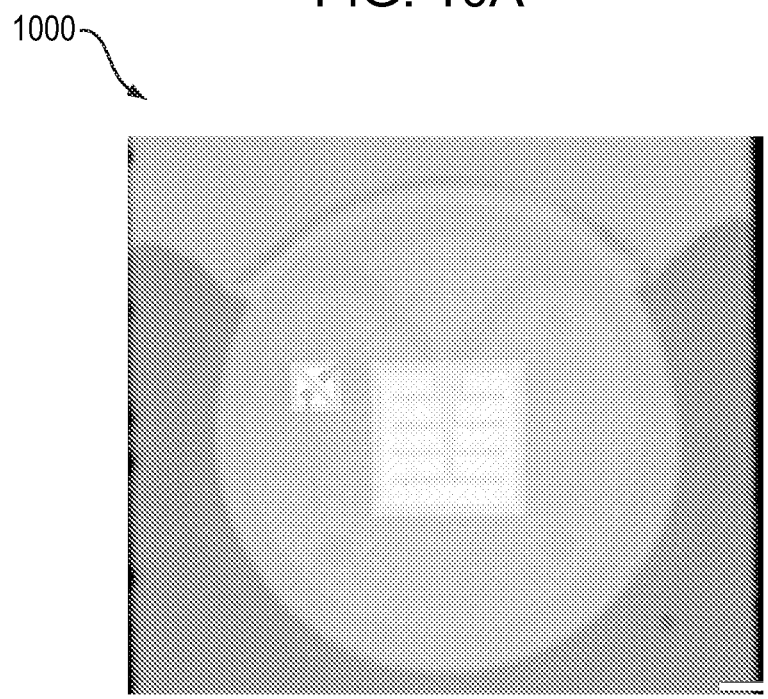
FIG. 10B is a plan view photograph of the light-emitting device of FIG. 10A during emission of light having a peak wavelength of approximately 230 nm in accordance with various embodiments of the invention.

FIG. 10A is a schematic view of a UV LED 1000 fabricated on an AlN substrate in accordance with embodiments of the present invention. As shown, the UV LED 1000 features a set of layers epitaxially grown over the AlN substrate 805 and two top-side metal contacts 845, 850. Specifically, immediately above the substrate is a 500 nm layer 1010 of undoped (i.e., unintentionally doped) AlN, topped with a bottom contact layer 820 of n-doped (with Si at a concentration of 2×10$^{18}$ cm$^{-3}$) Al$_{0.83}$Ga$_{0.17}$N that is 500 nm thick. Above the bottom contact layer 820 is a MQW layer 825 featuring five sets of a 2 nm thick $Al_{0.78}Ga_{0.22}N$ quantum well and a 6 nm thick $Al_{0.85}Ga_{0.15}N$ barrier, all of which are undoped. Above the MQW layer 825 is a 10 nm thick electron-blocking layer 830 formed of undoped $Al_{0.95}Ga_{0.05}N$. Above the electron-blocking layer 830 is an undoped graded layer 835 graded from $Al_{0.95}Ga_{0.05}n$ to GaN over a thickness of 30 nm. Finally, over the graded layer 835 is a 10 nm thick p-doped (with Mg at a concentration of $1\times10^{19}$ $cm^{-3}$) GaN cap layer 840. The p-metal layer 845 is formed over the cap layer 840, while the n-metal layer 850 is formed over the bottom contact layer 850 (revealed by etching away the overlying structure, as described above). FIG. 10B is a plan-view photograph of the UV LED 1000 of FIG. 10A when emitting light at approximately 230 nm. Devices such as that depicted in FIGS. 10A and 10B exhibited output powers between 20 µW and 500 µW at currents of 20 mA and at room temperature, continuous wave (CW) operation. Such output powers are indicative of external quantum efficiencies ranging from 0.02% to 0.5% in the wavelength range of 228 nm to 238 nm.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or the like techniques that some would refer to as "high-temperature CVD." Also, other terms are sometimes used to describe these and techniques that are used to grow bulk single AlN crystals in accordance with embodiments of the invention. Therefore, the terms "depositing," "growing," "depositing vapor species," and like terms are used herein to generally cover those techniques by which the crystal may be grown pursuant to embodiments of this invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. An annealed single-crystal AlN substrate having (i) a thermal conductivity of at least 250 W/mK and (ii) an ultraviolet (UV) absorption coefficient that is:
   a) less than 10 $cm^{-1}$ and no less than 5 $cm^{-1}$ for an entire wavelength range of 220 nm to 450 nm,
   b) less than 9 $cm^{-1}$ and no less than 5 $cm^{-1}$ for an entire wavelength range of 350 nm to 450 nm, and
   c) within ±2 $cm^{-1}$ for an entire wavelength range of 220 nm to 280 nm,
   wherein the single-crystal AlN substrate is cut from a single-crystal AlN boule having a diameter of the boule that is at least 25 mm and no more than 150 mm, wherein the diameter increases over a portion of a length of the boule, the length of the boule being at least 0.5 cm.

2. The single-crystal AlN substrate of claim 1, wherein the diameter is at least 50 mm and no more than 150 mm.

3. The single-crystal AlN substrate of claim 1, wherein the UV absorption coefficient is less than 30 $cm^{-1}$ for an entire wavelength range of 210 nm to 218 nm.

4. The single-crystal AlN substrate of claim 1, wherein the UV absorption coefficient is less than 8 $cm^{-1}$ and no less than 5 $cm^{-1}$ for an entire wavelength range of 240 nm to 280 nm.

5. The single-crystal AlN substrate of claim 1, wherein the UV absorption coefficient is less than 20 $cm^{-1}$ for an entire wavelength range of 215 nm to 218 nm.

6. The single-crystal AlN substrate of claim 1, further comprising a light-emitting device disposed thereon.

7. The single-crystal AlN substrate of claim 6, wherein the light-emitting device (i) comprises a light-emitting diode or a laser and (ii) emits UV light.

8. The single-crystal AlN substrate of claim 1, wherein an Urbach energy of the single-crystal AlN substrate ranges from 0.2 eV to 1.8 eV within an incident photon energy range of 5.85 eV to 6.0 eV, the Urbach energy $E_u$ being defined by:

$$\ln \alpha = \ln \alpha_0 + \left(\frac{hv}{E_U}\right)$$

wherein $\alpha$ is an absorption coefficient of the single-crystal AlN substrate at an incident photon energy $hv$, and $\alpha_0$ is a constant corresponding to the absorption coefficient at zero photon energy.

9. The single-crystal AlN substrate of claim 8, wherein the Urbach energy ranges from 0.21 eV to 1.0 eV.

10. The single-crystal AlN substrate of claim 1, wherein the single-crystal AlN substrate is produced via sublimation-recondensation.

11. The single-crystal AlN substrate of claim 1, wherein:
   a carbon concentration of the single-crystal AlN substrate is less than $3\times10^{17}$ $cm^{-3}$;
   an oxygen concentration of the single-crystal AlN substrate is less than $1\times10^{18}$ $cm^{-3}$; and
   a ratio of the carbon concentration of the single-crystal AlN substrate to the oxygen concentration of the single-crystal AlN substrate is less than 1.

12. An annealed single-crystal AlN boule having (i) an ultraviolet (UV) absorption coefficient of less than 30 $cm^{-1}$ for an entire wavelength range of 210 nm to 220 nm and (ii) a diameter that is at least 25 mm and no more than 150 mm, wherein the diameter increases over a portion of a length of the boule, and wherein the length of the boule is at least 0.5 cm.

13. The single-crystal AlN boule of claim 12, wherein the UV absorption coefficient is less than 30 $cm^{-1}$ and no less than 5 $cm^{-1}$ for the entire wavelength range of 210 nm to 220 nm.

14. The single-crystal AlN boule of claim 12, wherein the UV absorption coefficient is less than 30 $cm^{-1}$ and no less than 10 $cm^{-1}$ for the entire wavelength range of 210 nm to 220 nm.

15. The single-crystal AlN boule of claim 12, wherein the diameter is at least 25 mm and no more than 50 mm.

16. The single-crystal AlN boule of claim 12, wherein the diameter is at least 50 mm and no more than 150 mm.

17. The single-crystal AlN boule of claim 12, wherein the UV absorption coefficient is less than 8 $cm^{-1}$ for an entire wavelength range of 240 nm to 280 nm.

18. The single-crystal AlN boule of claim 12, wherein the UV absorption coefficient is less than 20 $cm^{-1}$ for an entire wavelength range of 215 nm to 220 nm.

19. The single-crystal AlN boule of claim 12, wherein the UV absorption coefficient is less than 15 cm$^{-1}$ for an entire wavelength range of 220 nm to 240 nm.

20. The single-crystal AlN boule of claim 12, wherein the UV absorption coefficient is less than 10 cm$^{-1}$ for a wavelength of 230 nm.

21. The single-crystal AlN boule of claim 12, wherein an Urbach energy of the single-crystal AlN boule ranges from 0.2 eV to 1.8 eV within an incident photon energy range of 5.85 eV to 6.0 eV, the Urbach energy $E_u$ being defined by:

$$\ln\alpha = \ln\alpha_0 + \left(\frac{h\nu}{E_U}\right)$$

wherein $\alpha$ is an absorption coefficient of the single-crystal AlN boule at an incident photon energy $h\nu$, and $\alpha_0$ is a constant corresponding to the absorption coefficient at zero photon energy.

22. The single-crystal AlN boule of claim 21, wherein the Urbach energy ranges from 0.21 eV to 1.0 eV.

23. The single-crystal AlN boule of claim 12, wherein the single-crystal AlN boule extends beneath and from a seed crystal having a diameter smaller than a maximum diameter of the single-crystal AlN boule.

24. The single-crystal AlN boule of claim 12, wherein the single-crystal AlN boule is produced via sublimation-recondensation.

25. The single-crystal AlN boule of claim 12, wherein:
a carbon concentration of the single-crystal AlN boule is less than $3\times10^{17}$ cm$^{-3}$;
an oxygen concentration of the single-crystal AlN boule is less than $1\times10^{18}$ cm$^{-3}$; and
a ratio of the carbon concentration of the single-crystal AlN boule to the oxygen concentration of the single-crystal AlN boule is less than 1.

\* \* \* \* \*